(12) United States Patent
Miyachi et al.

(10) Patent No.: US 9,231,163 B2
(45) Date of Patent: Jan. 5, 2016

(54) SEMICONDUCTOR LIGHT EMITTING APPARATUS

(71) Applicant: STANLEY ELECTRIC CO., LTD., Meguro-ku, Tokyo (JP)

(72) Inventors: Mamoru Miyachi, Okegawa (JP); Tatsuma Saito, Yokohama (JP); Takako Hayashi, Yokohama (JP); Yusuke Yokobayashi, Yokohama (JP); Takanobu Akagi, Yokohama (JP); Ryosuke Kawai, Yokohama (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/257,610

(22) Filed: Apr. 21, 2014

(65) Prior Publication Data

US 2014/0319455 A1    Oct. 30, 2014

(30) Foreign Application Priority Data

Apr. 25, 2013 (JP) ................................. 2013-092884

(51) Int. Cl.
*H01L 27/15* (2006.01)
*H01L 29/18* (2006.01)
(Continued)

(52) U.S. Cl.
CPC .............. *H01L 33/405* (2013.01); *H01L 33/06* (2013.01); *H01L 33/08* (2013.01); *H01L 33/382* (2013.01); *H01L 33/0079* (2013.01); *H01L 33/60* (2013.01); *H01L 33/62* (2013.01); *H01L 2224/16145* (2013.01); *H01L 2224/45144* (2013.01); *H01L 2224/48091* (2013.01); *H01L 2224/48464* (2013.01); *H01L 2924/10158* (2013.01)

(58) Field of Classification Search
CPC ..... H01L 33/382; H01L 33/405; H01L 33/44; H01L 33/20; H01L 33/0079; H01L 33/62; H01L 2933/0016; H01L 2933/0066
USPC .......... 257/81, 84, 88, 98, 99; 438/25–29, 34, 438/42
See application file for complete search history.

(56) References Cited

U.S. PATENT DOCUMENTS

| | | | |
|---|---|---|---|
| 8,138,516 B2 | 3/2012 | Unno | |
| 8,247,823 B2 | 8/2012 | Yahata et al. | |

(Continued)

FOREIGN PATENT DOCUMENTS

| | | |
|---|---|---|
| DE | 102007019775 A1 | 10/2008 |
| DE | 102007019776 A1 | 10/2008 |

(Continued)

OTHER PUBLICATIONS

Extended European Search Report dated Sep. 11, 2014 issued in counterpart European Application No. 14020055.1.

*Primary Examiner* — Hsien Ming Lee
(74) *Attorney, Agent, or Firm* — Holtz, Holtz, Goodman & Chick PC

(57) ABSTRACT

A semiconductor light emitting apparatus includes semiconductor lamination of n-type layer, active layer, and p-type layer; recess penetrating the lamination from the p-type layer and exposing the n-type layer; n-side electrode formed on the n-type layer at the bottom of the recess and extending upward above the p-type layer; a p-side electrode formed on the p-type layer and having an opening surrounding the recess in plan view, the n-side electrode extending from inside to above the recess; and an insulating layer disposed between the p-side and the n-side electrodes on the p-type layer, the p-side electrode constituting a reflective electrode reflecting light incident from the active layer, the n-side electrode including a reflective electrode layer covering the opening in plan view and reflects light incident from the emission layer side, the reflective electrode layer having peripheral portion overlapping peripheral portion of the p-side electrode in plan view.

11 Claims, 34 Drawing Sheets

(51) Int. Cl.
  *H01L 29/22* (2006.01)
  *H01L 21/00* (2006.01)
  *H01L 33/40* (2010.01)
  *H01L 33/38* (2010.01)
  *H01L 33/06* (2010.01)
  *H01L 33/08* (2010.01)
  *H01L 33/00* (2010.01)
  *H01L 33/60* (2010.01)
  *H01L 33/62* (2010.01)

(56) References Cited

U.S. PATENT DOCUMENTS

| | | | |
|---|---|---|---|
| 8,378,377 | B2 | 2/2013 | Sugizaki et al. |
| 8,390,021 | B2 * | 3/2013 | Nagai ............................. 257/99 |
| 2010/0117111 | A1 | 5/2010 | Illek et al. |
| 2011/0101390 | A1 | 5/2011 | Engl et al. |
| 2012/0007101 | A1 * | 1/2012 | Yang et al. ...................... 257/76 |
| 2012/0049219 | A1 * | 3/2012 | Kamiya et al. .................. 257/98 |
| 2012/0074441 | A1 | 3/2012 | Seo et al. |
| 2013/0187192 | A1 | 7/2013 | Hoeppel |
| 2014/0008770 | A1 | 1/2014 | Günther et al. |
| 2014/0183586 | A1 | 7/2014 | Kamiya et al. |

FOREIGN PATENT DOCUMENTS

| | | |
|---|---|---|
| DE | 102009022966 A1 | 12/2010 |
| DE | 102010025320 A1 | 12/2011 |
| DE | 102011011378 A1 | 8/2012 |
| EP | 2423984 A2 | 2/2012 |
| EP | 2525420 A2 | 11/2012 |
| JP | 2011-066304 A | 3/2011 |
| JP | 2011-199221 A | 10/2011 |
| JP | 2011-249501 A | 12/2011 |

* cited by examiner

SEMICONDUCTOR LIGHT EMITTING APPARATUS

CROSS REFERENCE TO RELATED APPLICATION

This application is based on, and claims the benefit of priority of, the prior Japanese Patent Application JP2013-092884, filed on Apr. 25, 2013, the entire contents of which are incorporated herein by reference.

BACKGROUND OF THE INVENTION

A) Field of the Invention

The present invention relates to a semiconductor light emitting apparatus.

B) Description of the Related Art

The semiconductor light emitting apparatus has a semiconductor lamination including an n-type semiconductor layer and a p-type semiconductor layer, an n-side electrode electrically connected to the n-type semiconductor layer, and a p-side electrode electrically connected to the p-type semiconductor layer. For example, if a p-side electrode is formed on the p-type semiconductor layer, a recess exposing the n-type semiconductor layer is formed from the side of the p-type semiconductor layer, and an n-side electrode is formed on the recess, the n-side electrode and the p-side electrode can be disposed on the same side of the semiconductor lamination (for example, see Japanese Laid-open Patent Publication No. 2011-066304, Japanese Laid-open Patent Publication No. 2011-249501, and Japanese Laid-open Patent Publication No. 2011-199221). Such a structure is convenient when electrodes are formed on a support substrate and the support substrate is joined with the semiconductor lamination.

SUMMARY OF THE INVENTION

An object of the embodiment is to provide a semiconductor light emitting apparatus having a novel electrode structure.

According to an aspect of the embodiment, there is provided a semiconductor light emitting apparatus, comprising:

a first semiconductor layer of a first conductivity type;

a light emitting layer formed on the first semiconductor layer;

a second semiconductor layer of a second conductivity type opposite to the first conductivity type, formed on the light emitting layer and having an upper surface;

recess formed from the upper surface of the second semiconductor layer, penetrating through the second semiconductor layer and the light emitting layer and exposing the first semiconductor layer at bottom;

a first electrode electrically connected to the first semiconductor layer at the bottom of the recess and extending upward to extend above the upper surface of the second semiconductor layer;

a second electrode electrically connected to the upper surface of the second semiconductor layer and having an opening which surrounds the recess in plan view and through which the first electrode extends from the inside of the recess to above the upper surface of the second semiconductor layer; and an insulating layer disposed between the first and second electrodes above the upper surface of the second semiconductor layer;

wherein the second electrode constitute a reflective electrode that reflects light incident from the light emitting layer side, wherein the first electrode includes a reflective electrode layer formed covering the opening in plan view, that reflects light incident from the light emitting layer side, and wherein the reflective electrode layer of the first electrode has a peripheral portion overlapping a peripheral portion of the second electrode defining the opening in plan view.

The light extracting efficiency can be enhanced by forming the light reflective electrode layer of the first electrode overlapping the second electrode at the peripheral portion.

DESCRIPTION OF THE PREFERRED EMBODIMENTS

First, a semiconductor light emitting apparatus according to a first embodiment of the invention will be described. FIGS. 1A to 1L are schematic cross-sectional views illustrating processes of manufacturing a semiconductor light emitting element according to the first embodiment. In the present embodiment, a nitride-series semiconductor light emitting element is formed. Here, the term "nitride series" means compound including nitrogen as group V element. For example, a metal organic chemical vapor deposition (MOCVD) is used as a method of growing a semiconductor layer. A plurality of light emitting elements is formed at the same time on one growth substrate. FIGS. 1A to 1L illustrate process of manufacturing representative one element.

Figure 1A:
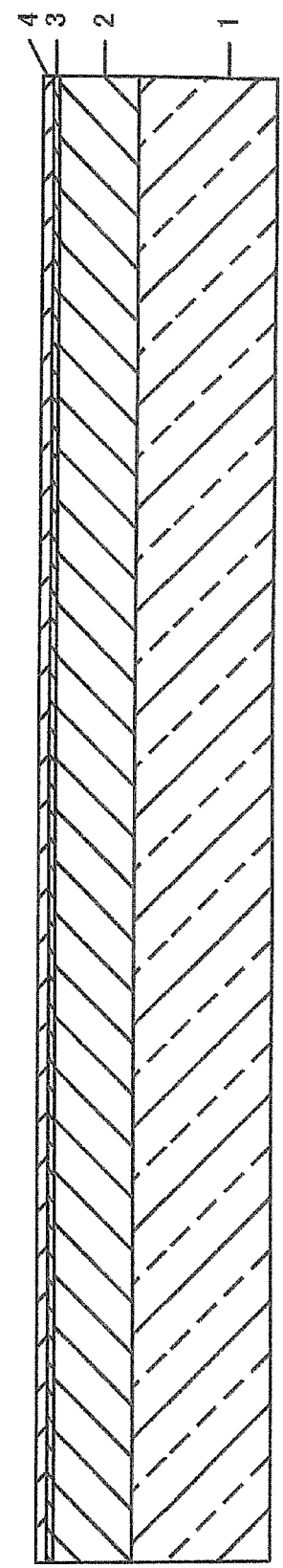
FIGS. 1A to 1V are cross-sectional views schematically illustrating a manufacturing method of a semiconductor light emitting apparatus according to a first embodiment.

As illustrated in FIG. 1A, a sapphire substrate is prepared as a growth substrate 1. The growth substrate 1 is loaded in an MOCVD apparatus, and thermal cleaning is performed. A GaN buffer layer and an undoped GaN layer are grown on a cleaned substrate, and then an n-type GaN layer 2 doped with n-type impurity such as Si and having a film thickness of about 5 μm is grown. In FIG. 1A and other figures, the GaN buffer layer and the undoped GaN layer are collectively illustrated as the n-type GaN layer 2.

A light emitting layer (active layer) 3 is grown on the n-type GaN layer 2. A multiple quantum well structure including, for example, InGaN layers as well layers, and GaN layers as barrier layers alternately laminated, is formed as the light emitting layer 3. A p-type GaN layer 4 doped with p-type impurity such as Mg and having a film thickness of about 0.5 μm is grown on the light emitting layer 3.

The growth substrate 1 is a single-crystal substrate having a lattice constant that enables epitaxial growth of GaN. A material is selected from those which are transparent to the light at a wavelength of 362 nm, absorption edge wavelength of GaN, so that the substrate can be peeled off by laser lift-off in a later process. Spinel, SiC, ZnO, and the like may be used, as well as sapphire.

Figure 1B:
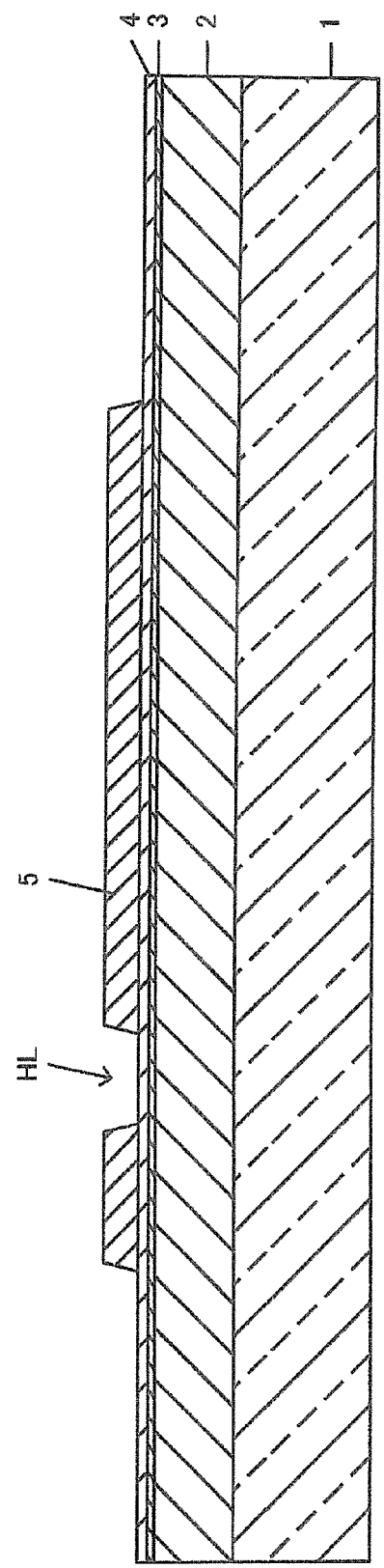

As illustrated in FIG. 1B, a reflective metal layer, for example formed of Ag added with additive such as Ni, Pt, Ti, or Pd and having a thickness of 200 nm is deposited by electron beam vapor deposition on the p-type GaN layer 4, and is patterned by lift-off to form a p-side electrode 5 of desired shape. It is preferable that the p-side electrode layer 5 includes one material selected from the group consisting of Ag, Pt, Ni, Al, Pd, and alloys thereof, so as to serve as a reflective electrode.

Figure 2:
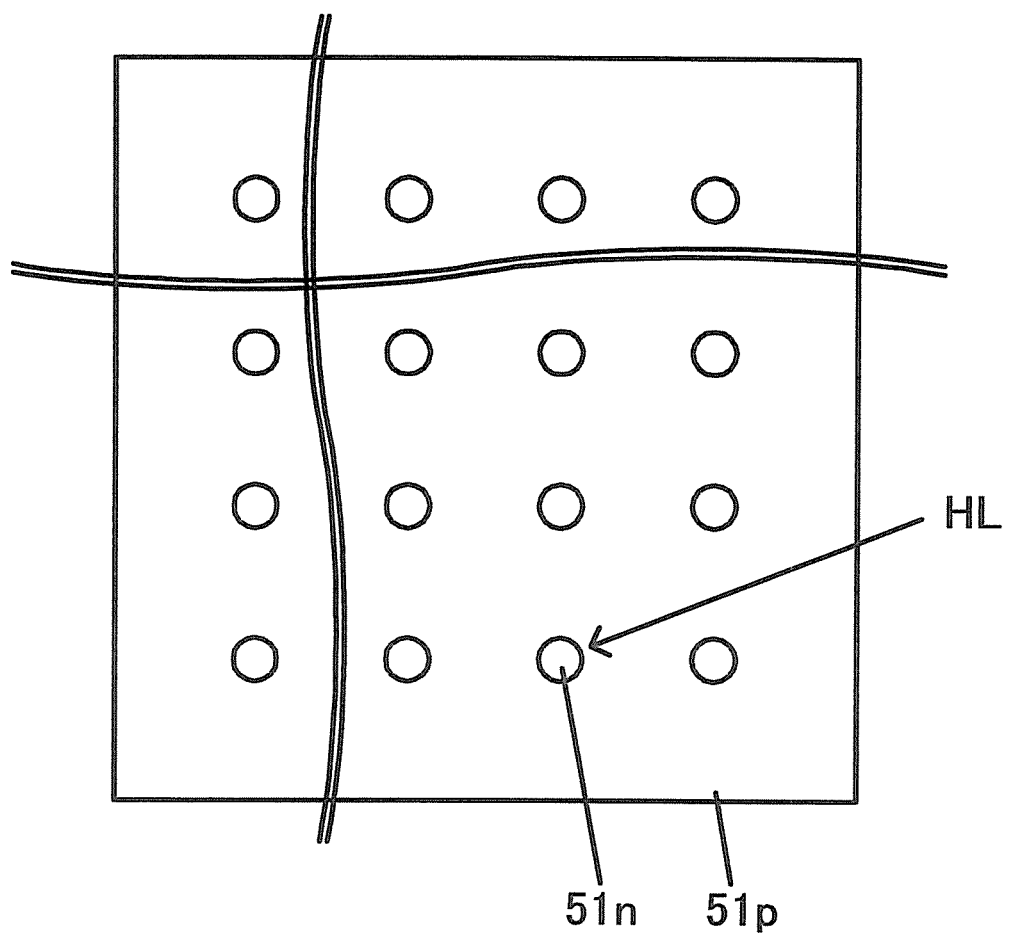
FIG. 2 is a plan view schematically illustrating a plane structure of contact portions of p-side electrodes and n-side electrodes with a semiconductor layer in a semiconductor light emitting element according to an embodiment.

FIG. 2 is a schematic plan view illustrating a plane structure of contact portions of p-side electrodes 51p and n-side electrodes 51n with semiconductor layers in the semiconductor light emitting element of embodiment. The p-side electrode 51p is formed spreading on the upper surface of the p-type semiconductor layer. Holes HL are formed to distribute discretely in the p-side electrode 51p, for example, in matrix shape. Inside each hole HL, an n-side electrode (via electrode) 51n is disposed. One element may have a rectangular shape having, for example, a size of about 600 μm×1300 μm. The number of via electrodes 51n arranged in one element is, for example, about 40.

FIG. 1B and other figures representatively illustrate processes of forming one n-side via electrode and illustrate one hole HL formed in the p-side electrode layer 5.

Figure 1C:
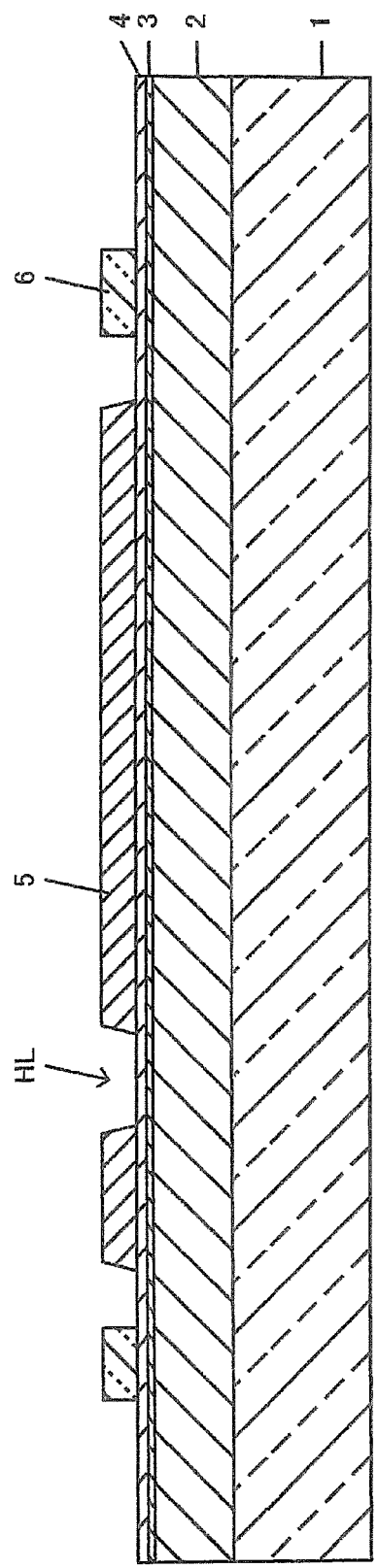

As illustrated in FIG. 1C, a fringe layer 6 is formed by depositing an $SiO_2$ layer having a film thickness equal to the thickness of the p-side electrode layer 5, for example, by sputtering on the p-type GaN layer 4 outside the p-side electrode layer 5 so as to surround the circumference of the p-side electrode layer 5.

Figure 1D:
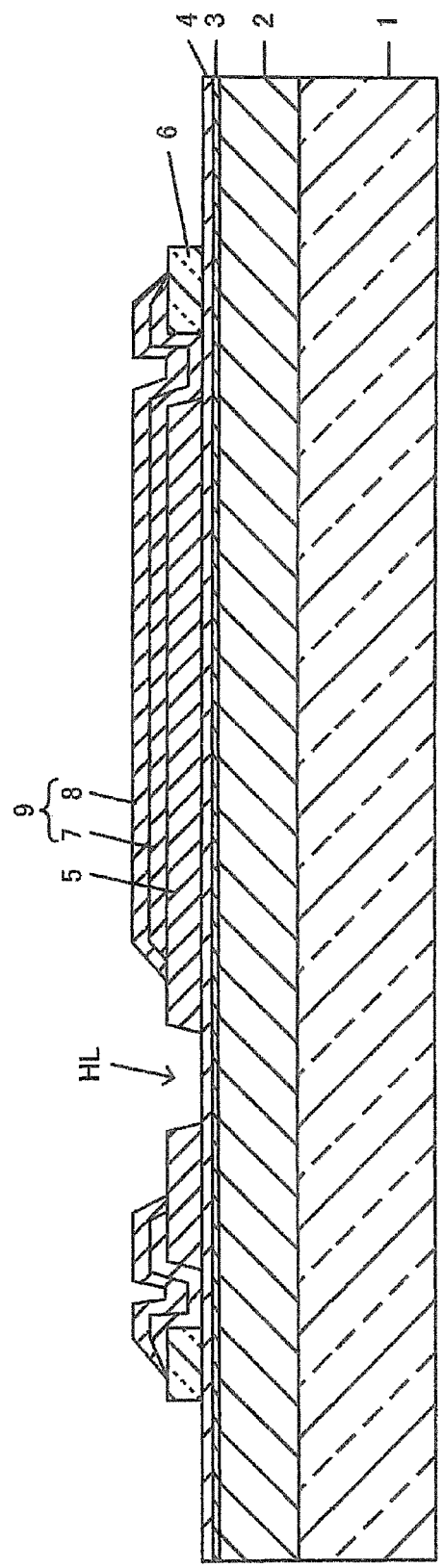

As illustrated in FIG. 1D, on upper surfaces of the p-side electrode layer 5 and the fringe layer 6, and on the p-type GaN layer 4 between the p-type electrode layer 5 and the fringe layer 6, an Ag layer of a thickness of 100 nm which will become a highly reflective layer is deposited for example by sputtering, and successively TiW/Ti/Pt/Au/Ti lamination (left side layer is formed on the substrate side or lower side, to represent laminated structure), which will become diffusion preventing layer, is formed with thicknesses 250 nm/50 nm/100 nm/1000 nm/30 nm for example by sputtering, and the lamination is patterned by lift-off, to form a p-side highly reflective cap layer 9.

The p-side electrode layer 5 is doped with additive such as Ni, Pt, Ti, or Pd to enhance ohmic contact with the p-type GaN layer 4. In contrast, no additive is doped to the p-side highly reflective layer 7.

The p-side diffusion preventing layer 8 serves to prevent diffusion of elements used in the p-side electrode layer 5 and the p-side highly reflective layer 7. When the p-side electrode layer 5 and the p-side highly reflective layer 7 include Ag, the p-side diffusion preventive layer 8 can use Ti, W, Pt, Pd, Mo, Ru, Ir, Au, and an alloy thereof.

The p-side highly reflective cap layer 9 is not formed in the vicinity of the edge of the hole HL, and the edge of the p-side highly reflective cap layer 9 on the side of the hole HL is disposed to be separated from the edge of the hole HL to the outer side. The peripheral portion of the p-side diffusion preventive layer 8 is formed to cover the peripheral portion of the p-side highly reflective cap layer 9. In plan view, the edge of the p-side diffusion preventive layer 8 is disposed inside the edge of the p-side highly reflective layer 7.

At the edge of the p-side highly reflective cap layer 9 on the circumference side of the element, the edge of the p-side highly reflective layer 7 coincides with the edge of the p-side diffusion preventive layer 8, and is disposed on the upper surface of the fringe layer 6. The structure in which the edge of the p-side highly reflective cap layer 9 is disposed on the upper surface of the fringe layer 6, i.e. separated from the semiconductor layers 2, 3, and 4 functions as a leakage stopper of Ag in the p-side highly reflective cap layer 9.

Figure 1E:
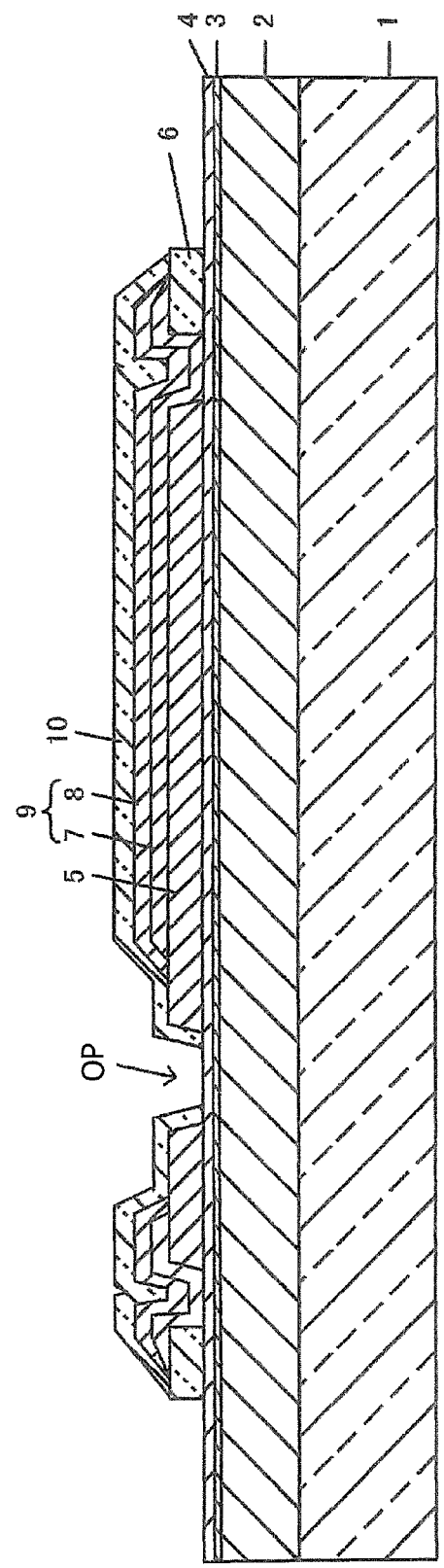

As illustrated in FIG. 1E, an insulating cap layer 10 is formed by depositing an $SiO_2$ film having a thickness of 300 nm, covering the p-side highly reflective cap layer 9, the p-side electrode layer 5, and the fringe layer 6, for example by sputtering, and is patterned by lift-off. As the patterning method, dry etching using $CF_4$-based gas, for example, can be used after forming a layer of $SiO_2$ on the entire surface, as well as the lift-off.

The insulating cap layer 10 has a function of preventing leakage of the Ag-based material used in the p-side electrode layer 5 and the p-side highly reflective layer 7 of the p-side highly reflective cap layer 9. An insulating material such as $SiO_2$, or SiN can also be used.

The insulating cap layer 10 is formed to cover the edge of the hole HL and to extend on the side surface of the p-side electrode layer 5 that defines the hole HL. The side surfaces of the p-side electrode layer 5 are covered with the insulating cap layer 10. The insulating cap layer 10 has a corresponding opening OP in the hole HL, and the p-type GaN layer 4 is exposed at the bottom of the opening OP.

Figure 1F:
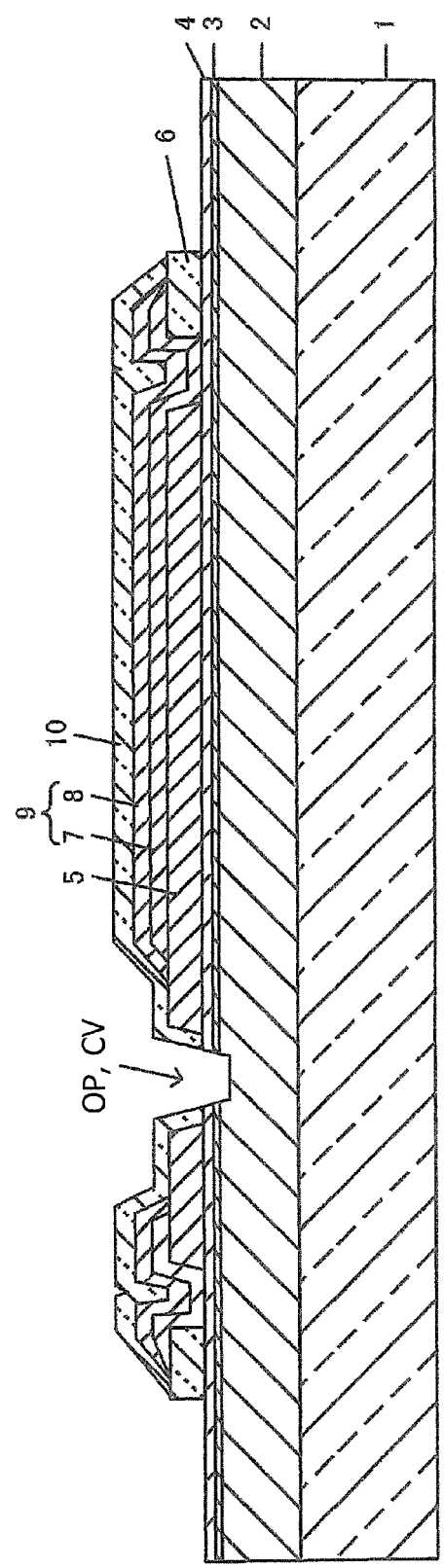

As illustrated in FIG. 1F, the p-type GaN layer 4 exposed in the opening OP of the insulating cap layer 10 and the light emitting layer 3 therebelow are removed by, for example, reactive ion etching (RIE), to expose the n-type GaN layer, forming a recess CV which provides a contact area for an n-side electrode. The insulating cap layer 10 functions as an etching mask.

Figure 1G:
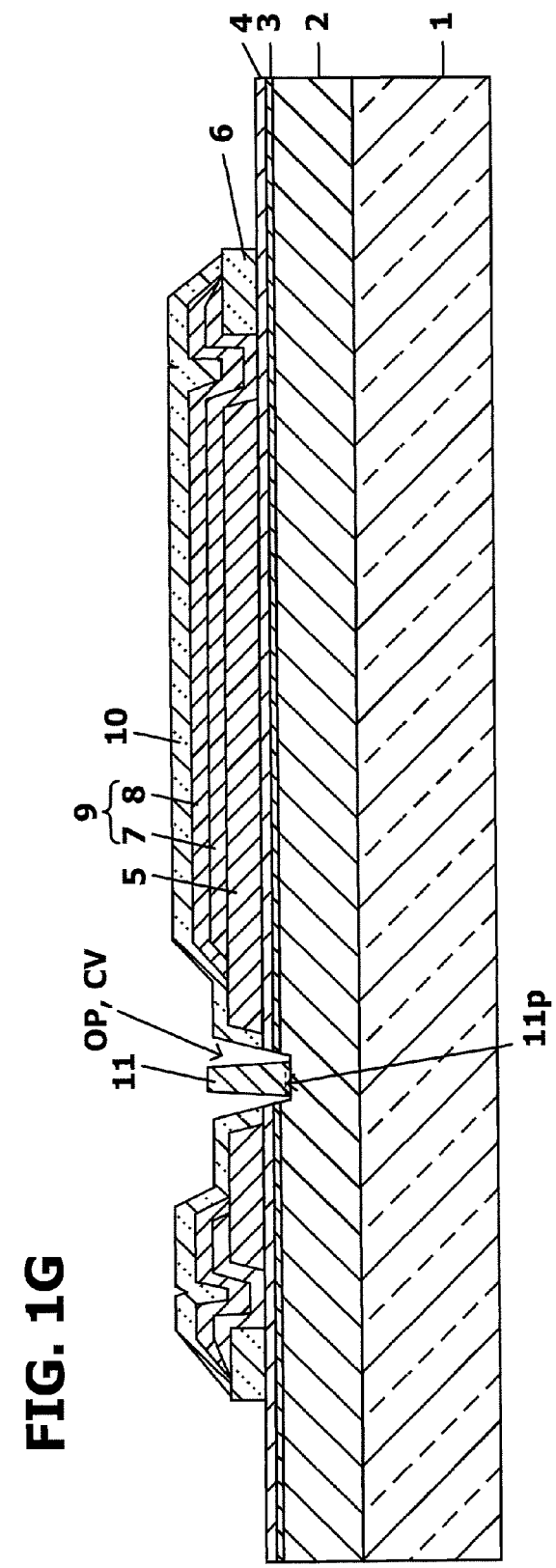

As illustrated in FIG. 1G, an n-side via electrode 11 is formed on the n-type GaN layer 2 exposed at the bottom of the recess CV, using lift-off, using, for example Al, or preferably Ag or an Ag alloy from the viewpoint of high reflectance. A Ti film 11p having a thickness of 1 nm may be vapor deposited under the Ag or Ag alloy layer as a contact material with the n-type GaN layer 2 to provide appropriate contact resistance and high reflectance.

For example, the diameter of one hole HL formed in the p-side electrode layer 5 is about 40 μm, the diameter of the edge of the recess CV is about 35 μm, and the diameter of the bottom portion of the via electrode 11 is about 30 μm.

Figure 1H:
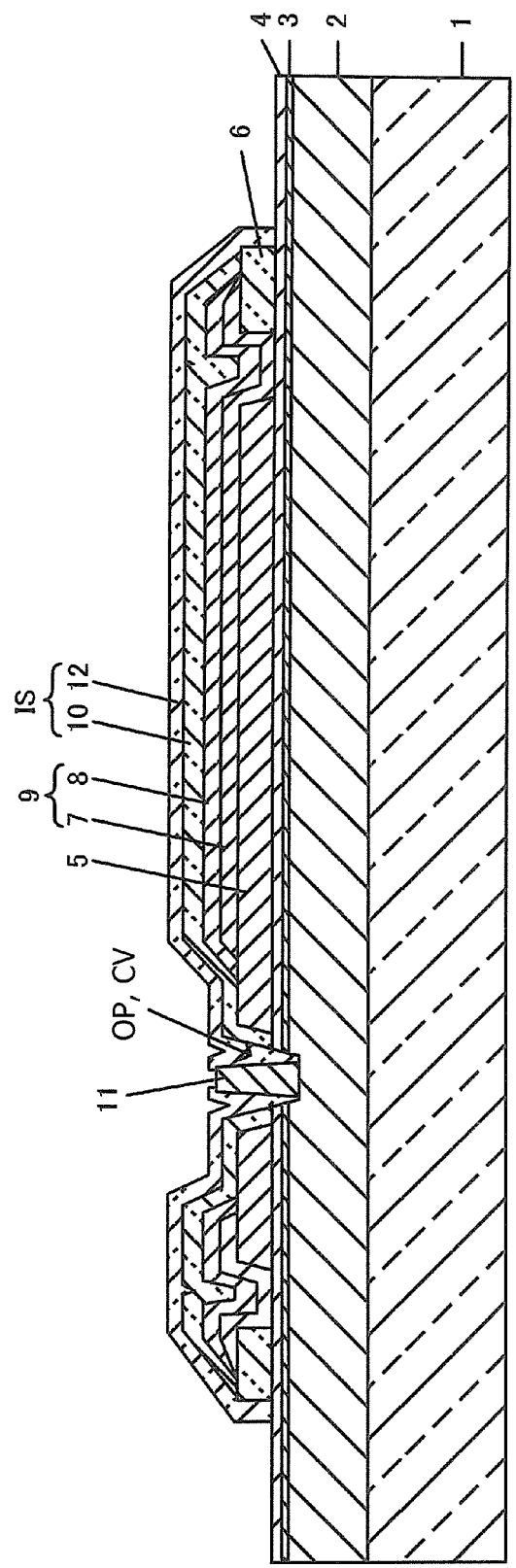

As illustrated in FIG. 1H, an insulating floating layer 12 is formed by depositing an $SiO_2$ film having a thickness of 600 nm by sputtering, covering the p-side electrode layer 5, the fringe layer 6, the p-side highly reflective cap layer 9, and the insulating cap layer 10, and patterning by lift-off or dry etching using $CF_4$-based gas. An insulating material such as $SiO_2$, or SiN can be used, as a material of the floating layer 12.

The insulating floating layer 12 is formed to extend to the inside of the opening OP and the recess CV, covering the pn junction region exposed to the side surface of the recess CV. The insulating floating layer 12 has an opening on the upper surface of the n-side via electrode 11. An inter-electrode insulating layer IS between the p-side and the n-side electrodes is formed by the lamination of the insulating cap layer 10 and the insulating floating layer 12. The inter-electrode insulating layer IS is interposed between a p-side electrode Ep and an n-side electrode En to be completed by the later process, and electrically separates the p-side electrode Ep and the n-side electrode En.

Figure 1I:
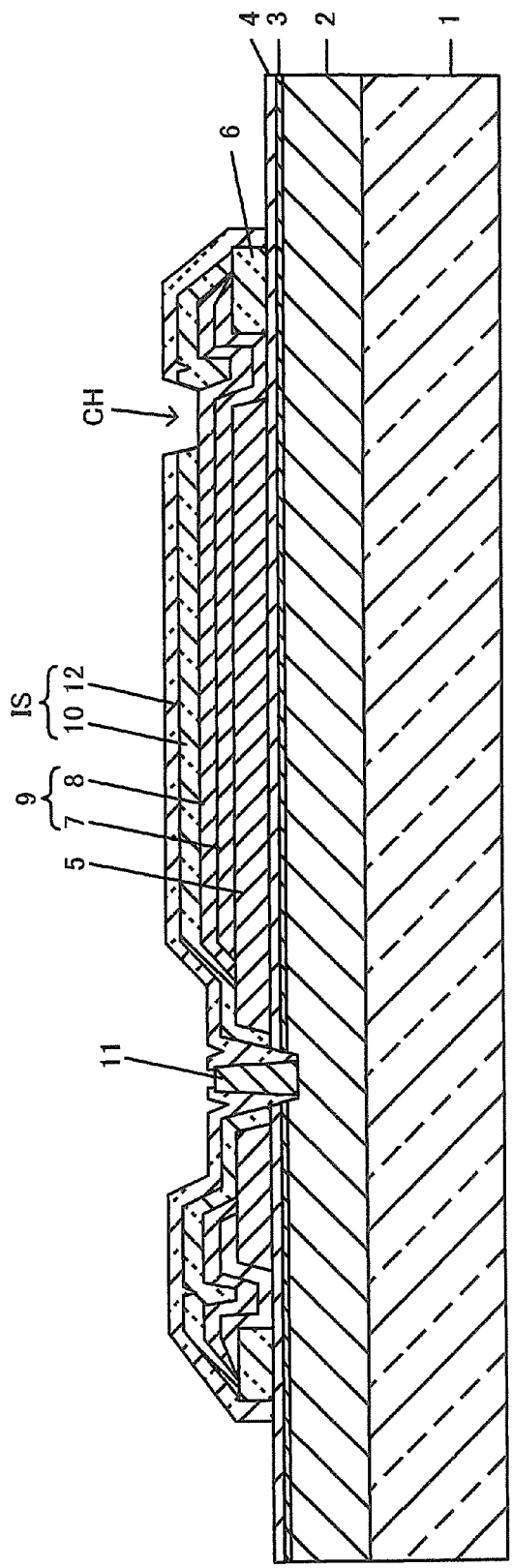

As illustrated in FIG. 1I, a contact hole CH for connecting the p-side electrode is formed by removing a partial region of the inter-electrode insulating layer IS, for example, in the vicinity of the edge portion of the element, for example, by RIE, and exposing the upper surface of the p-side highly reflective cap layer 9.

Figure 1J:
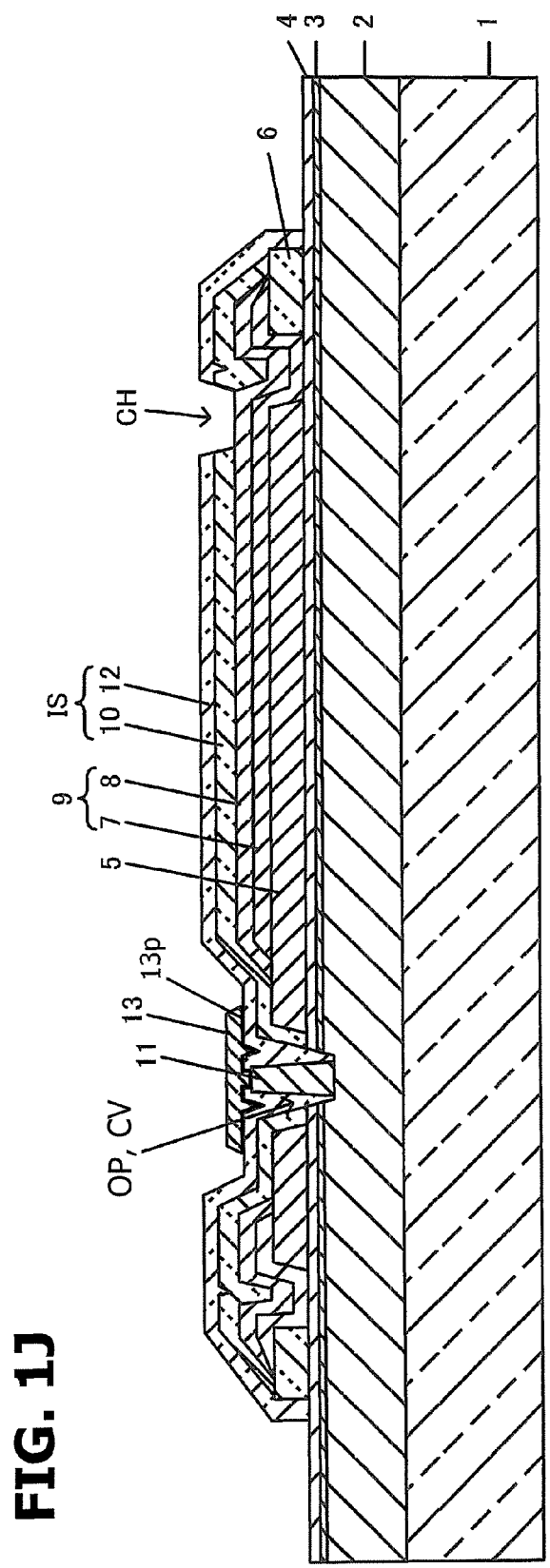

As illustrated in FIG. 1J, an n-side highly reflective layer 13 is formed by depositing Ag/Ti/Pt/Au layers respectively having thicknesses of 200 nm, 100 nm, 200 nm, and 200 nm on the n-side via electrode 11, for example, by electron beam deposition or sputtering, and by patterning using lift-off. A function of reflecting light progressing from the lower side through the insulating layers 10 and 12 and returning light to an n-type semiconductor layer 2 side is provided. Further, a Ti layer 13p may be formed as an undercoat of the Ag layer in order to enhance the adhesion with the insulating layer 12. However, the reflectance is reduced by Ti, so the thickness of the Ti layer 13p is preferably selected 5 nm or less, for example, 1 nm.

In plan view, the n-side highly reflective layer 13 is formed so that the peripheral portion of the n-side highly reflective layer 13 overlaps the peripheral portion of the p-side electrode layer 5 which defines the hole HL. Details of the arrangement of the n-side highly reflective layer 13 with related elements will be described with reference to FIG. 3A.

Figure 1K:
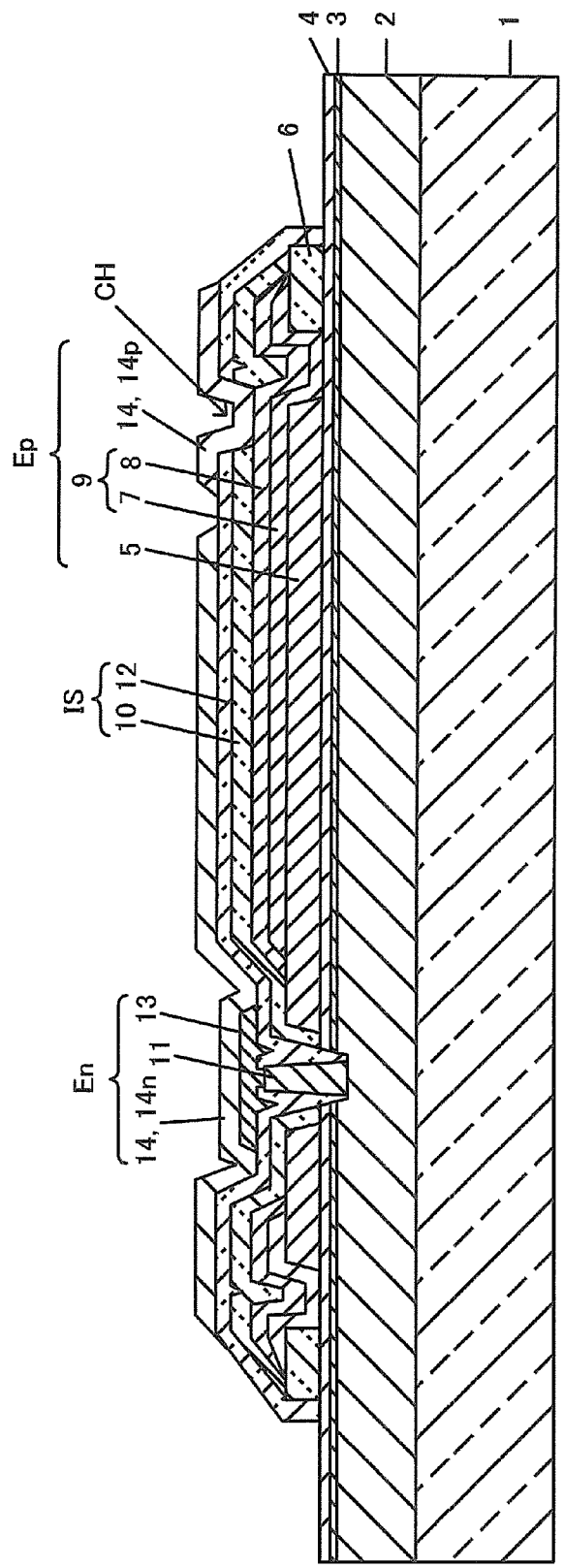

As illustrated in FIG. 1K, a conductive layer 14 divided in n-side portion and p-side portion, is formed by depositing Ti/Pt/Au layers respectively having thicknesses of 50 nm, 100 nm, and 400 nm by electron beam deposition or sputtering, and performing patterning by lift-off.

Portion of the conductive layer 14 which extends from above the n-side highly reflective layer 13 onto the inter-electrode insulating layer IS covering the p-side highly reflective cap layer 9 forms an n-side cap layer (n-side connection electrode) 14n. The n-side via electrode 11, the n-side highly reflective layer 13, and the n-side cap layer 14n form the n-side electrode En of the element.

Portion of the conductive layer 14 which is formed in the contact hole CH and is electrically separated from the n-side cap layer 14n by interposing a gap from the n-side cap layer 14n forms a p-side connection electrode 14p. The p-side electrode layer 5, the p-side highly reflective cap layer 9, and the p-side connection electrode 14p form the p-side electrode Ep of the element.

Figure 1L:
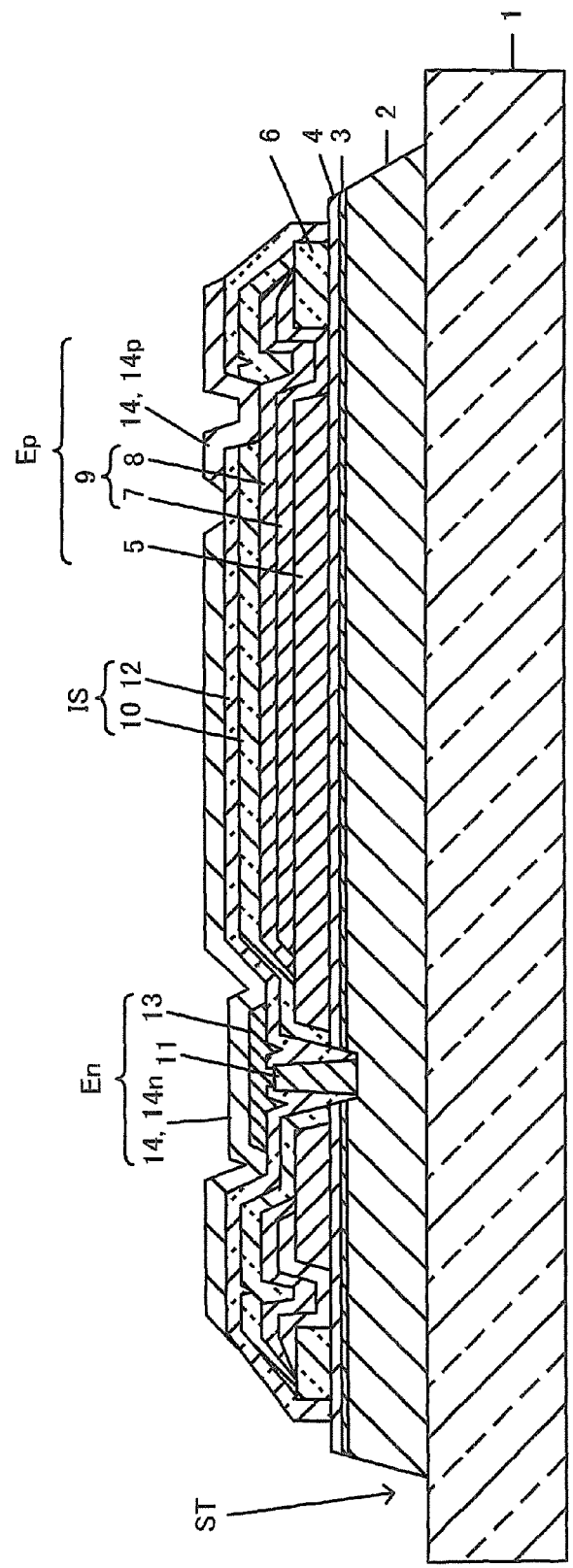

As illustrated in FIG. 1L, street ST is formed by removing the p-type semiconductor layer 4, the light emitting layer 3, and the n-type semiconductor layer 2 in a region between neighboring elements by RIE using, for example, chlorine gas, using a photoresist mask, exposing the growth substrate 1, and separating the neighboring elements. In this manner, the semiconductor light emitting element according to the first embodiment is formed.

Figure 3A:
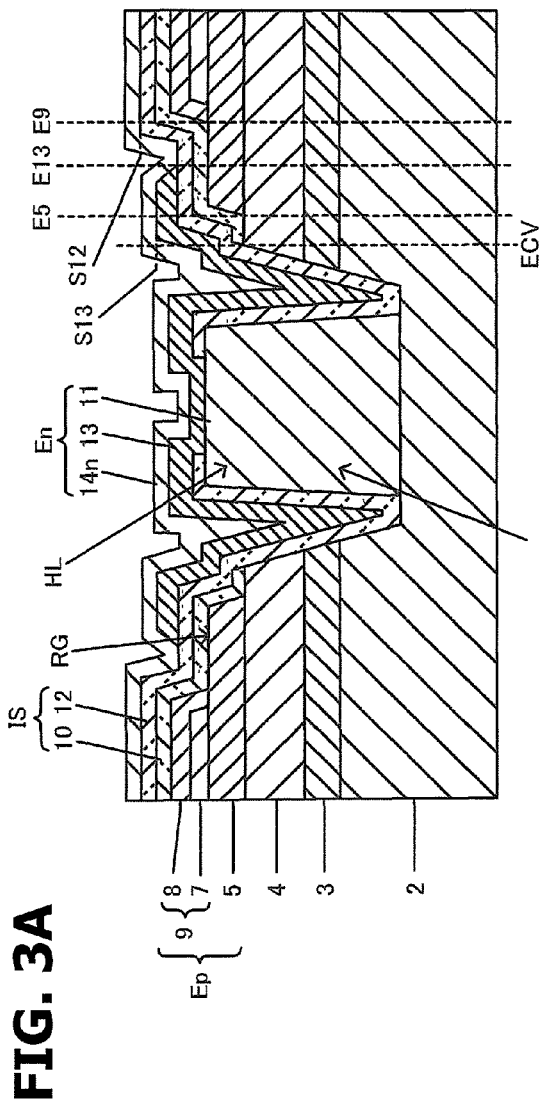
FIG. 3A is a cross-sectional view schematically illustrating structure in the vicinity of an n-side highly reflective layer of the semiconductor light emitting element according to the first embodiment.
Figure 3B:
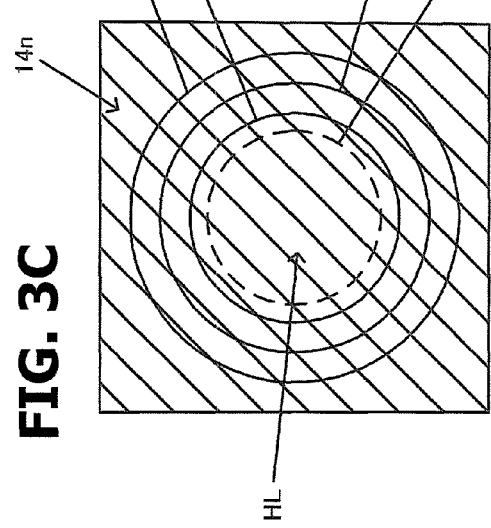
FIGS. 3B and 3C are plan views schematically illustrating arrangement of the n-side highly reflective layer according to the first embodiment.
Figure 3C:
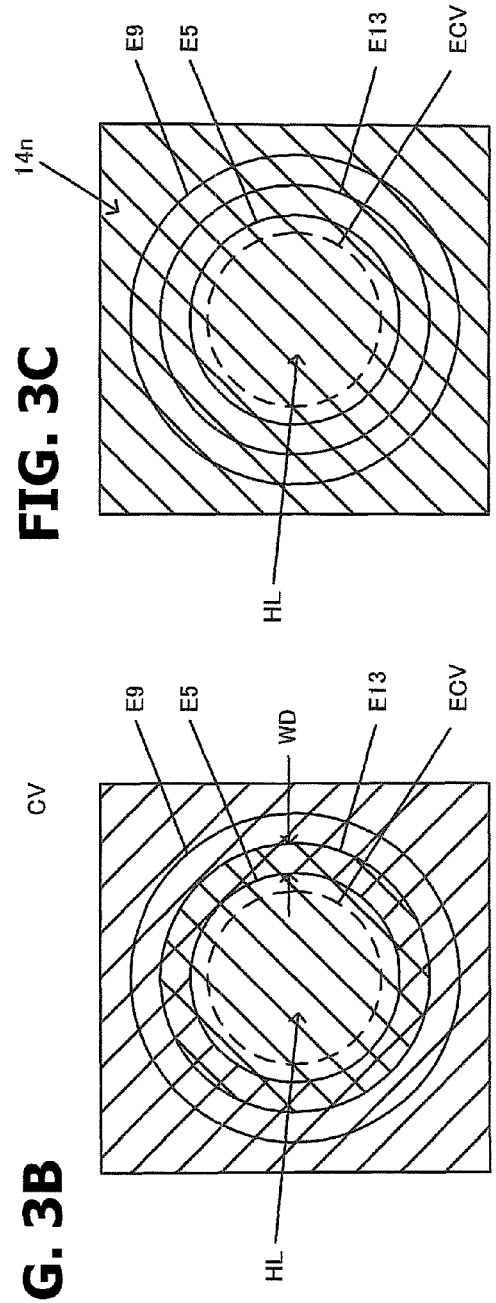

With reference to FIGS. 3A to 3C, structure in the vicinity of the n-side highly reflective layer 13 of the semiconductor light emitting element according to the first embodiment will be described. FIG. 3A is a schematic cross-sectional view illustrating a portion in the vicinity of the n-side highly reflective layer 13, and FIGS. 3B and 3C are schematic plan views illustrating plane arrangement of the n-side highly reflective layer 13 and related elements.

The hole HL is formed in the p-side electrode layer 5 of the p-side electrode Ep. The recess CV is formed by using the insulating cap layer 10 covering the p-side electrode as an etching mask and exposes the n-type semiconductor layer 2 at the bottom. The n-side via electrode 11 is formed on the n-type semiconductor layer 2 in the recess CV. In plan view, edge E9 of the p-side highly reflective cap layer 9 surrounding the hole HL is located on outer side (with respect to the hole HL) than edge E5 of the p-side electrode layer 5 that defines the hole HL. In plan view, the edge E5 of the hole HL surrounds upper edge ECV of the recess CV formed in the semiconductor layers 2, 3, and 4.

The p-side electrode Ep has a flat region RG formed by an upper surface of the p-side electrode layer 5 inside (with respect to the hole HL) the edge E9 of the p-side highly reflective cap layer 9. A peripheral portion of the n-side highly reflective layer 13 is formed on the inter-electrode insulating layer IS formed on the flat region RG. In plan view, the n-side highly reflective layer 13 covers the hole HL and overlaps a peripheral portion of the p-side electrode layer 5. Edge E13 of the n-side highly reflective layer 13 is located outside the edge E5 of the p-side electrode layer 5 and is located inside the edge E9 of the p-side highly reflective cap layer 9.

The n-side highly reflective layer 13 and the p-side highly reflective cap layer 9 do not overlap each other. FIG. 3B illustrates the n-side highly reflective layer 13 by left side lowering hatching, and the p-side electrode layer 5 and the p-side highly reflective cap layer 9 by right side lowering hatching. The overlapped portion between the n-side highly reflective layer 13 and the p-side electrode layer 5 is cross-hatched. The width WD of the cross-hatched portion in which peripheral portions of the n-side highly reflective layer 13 and the p-side electrode Ep are overlapped with each other is preferably 25 μm or less, for example.

In plan view, the n-side cap layer 14n is formed to cross the edge E13 of the n-side highly reflective layer 13 and also cross the edge E9 of the p-side highly reflective cap layer 9, and overlaps the p-side highly reflective cap layer 9. In FIG. 3C, the n-side cap layer 14n is illustrated by left side lowering hatching.

The inter-electrode insulating layer IS is formed to ride on a portion of the upper surface of the p-side highly reflective cap layer 9. A height S13 of the upper surface of the peripheral portion of the n-side highly reflective layer 13 riding on the flat region RG inside the edge E9 is lower than a height S12 of the upper surface of the inter-electrode insulating layer IS outside the edge E9.

Remaining processes of manufacturing the semiconductor light emitting apparatus according to the first embodiment will be described with reference to FIGS. 1M to 1V. FIGS. 1M to 1V are schematic cross-sectional views illustrating the processes of manufacturing the semiconductor light emitting apparatus according to the first embodiment.

Figure 1M:
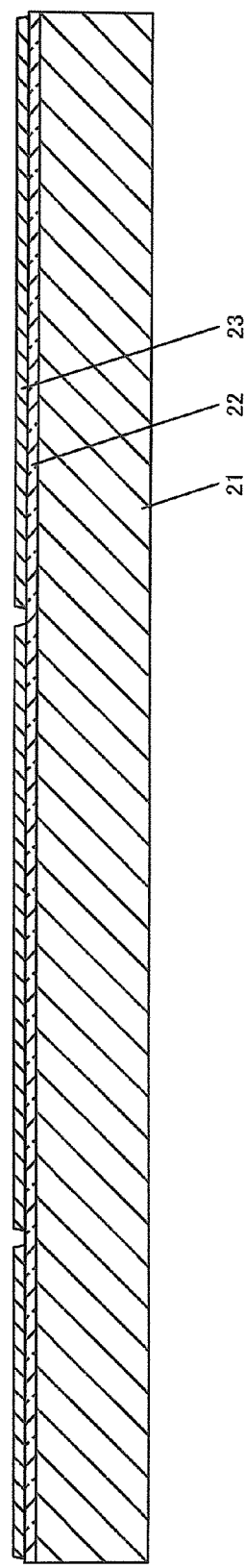

As illustrated in FIG. 1M, for example, a silicon substrate is prepared as a supporting substrate 21. An $SiO_2$ insulating layer 22 is formed by thermal oxidation. The supporting substrate 21 is preferably formed with a material having a thermal expansion coefficient close to sapphire ($7.5 \times 10^{-6}$/K) or GaN ($5.6 \times 10^{-6}$/K) and high thermal conductivity. Examples include Si, AlN, Mo, W, and CuW. The thickness of the insulating layer 22 may be a thickness that can achieve an object of securing insulation.

For example, a fusion or melt layer 23 which will form electrode is formed on the supporting substrate by depositing an AuSn (Sn: 20 wt %) having a thickness of 1 μm by, for example, resistance heating vapor deposition on the insulating layer 22. The support substrate electrodes 23 will be adhered to the n-side connection electrode 14*n* and the p-side connection electrode 14*p* on the element. Examples of materials of the support substrate electrode 23, the n-side connection electrode 14*n*, and the p-side connection electrode layer 14*p* which become bonded adhesion layers include metals including Au—Sn, Au—In, Pd—In, Cu—In, Cu—Sn, Ag—Sn, Ag—In, and Ni—Sn which can be joined by fusion or melt joining and metals including Au, which can be joined by diffusion joining.

Figure 1N:
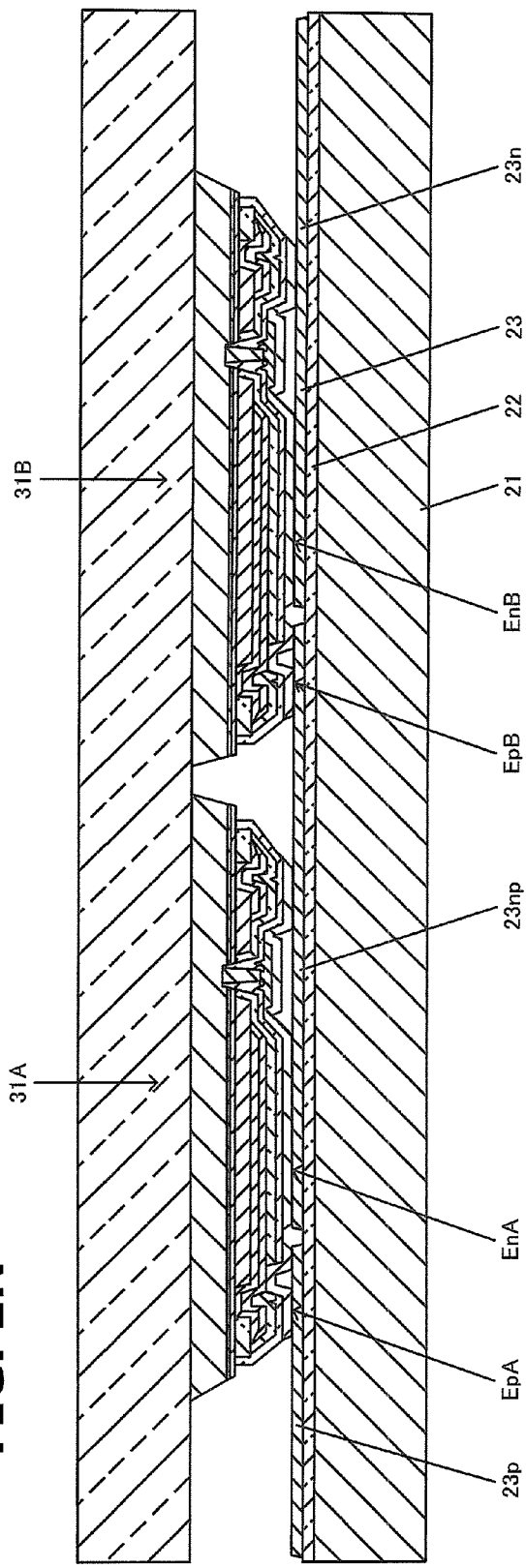
Figure 10:
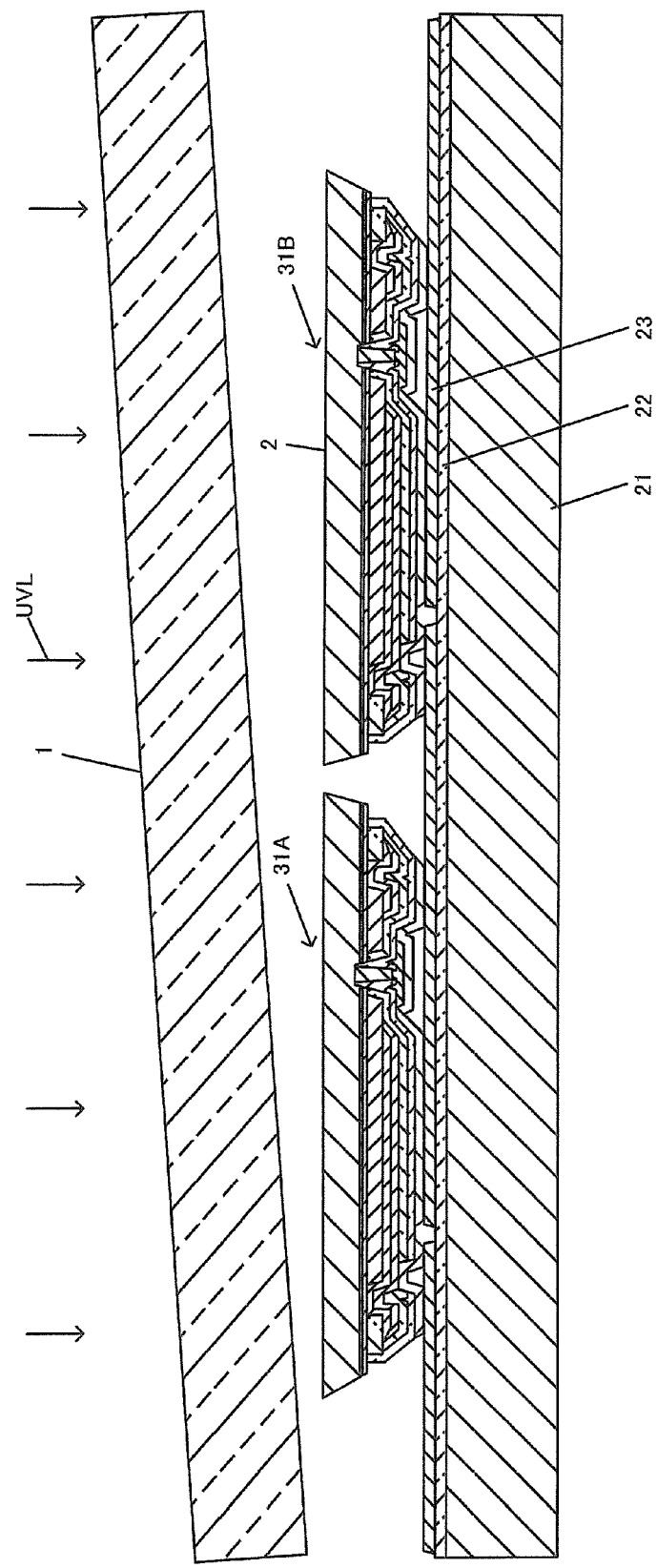

As illustrated in FIG. 1N, in the present example, processes of manufacturing a light emitting apparatus having a structure in which two light emitting elements 31A and 31B are connected in series is illustrated as an example. More elements may be connected according to necessity. For example, four light emitting elements can be connected in series, if necessary.

On the support substrate 21, there are formed electrode layer 23*p* to be connected to the p-side electrode EpA of the light emitting element 31A, electrode layer 23*np* to be connected to the n-side electrode EnA of the light emitting element 31A and the p-side electrode EpB of the light emitting element 31B, and electrode layer 23*n* to be connected to the n-side electrode EnB of the light emitting element 31B, in a manner of being electrically separated from each other.

The support substrate electrodes 23*p*, 23*np*, and 23*n*, the n-side connection electrode layer 14*n*, and the p-side connection electrode layer 14*p* of each element are aligned and adhered, for example, heated to 300° C. in a state of applying pressure to 3 MP, and maintained for 10 minutes. Thereafter, the fusion joining is performed by cooling the resultant to room temperature.

In this manner, the electric connection structure in which the p-side electrode EpA of the light emitting element 31A by the electrode layer 23*p* is extracted, the n-side electrode EnA of the light emitting element 31A and the p-side electrode EpB of the light emitting element 31B are connected in series by the electrode layer 23*np*, and the n-side electrode EnB of the light emitting element 31B is extracted by the electrode layer 23*n* is formed.

As illustrated in FIG. 1O, the growth substrate 1 is peeled off using laser lift-off by radiating, for example, a UV laser beam UVL from the rear side of the sapphire substrate 1, and decomposing the buffer layer by heating. Methods such as etching or the like may also be used for peeling off or removing the growth substrate 1.

Subsequently, Ga generated by the laser lift-off is removed by hot water and the like, and the surface is treated by a hydrochloric acid or the like. According to this, the n-type GaN layer 2 is exposed. The surface treatment may be a method that can etch a nitride semiconductor, and an agent such as acids such as phosphoric acid and sulfuric acid and alkali such as KOH and NaOH can be used. Additionally, the surface treatment may be performed by dry etching using Ar plasma or chlorine-based plasma, polishing, or the like. Further, the surface of the n-type GaN layer 2 is subjected to a Cl or Ar treatment using an apparatus for dry etching such as RIE or a smoothing treatment using a CMP polishing apparatus to remove a laser mark or a laser damaged layer.

Figure 1P:
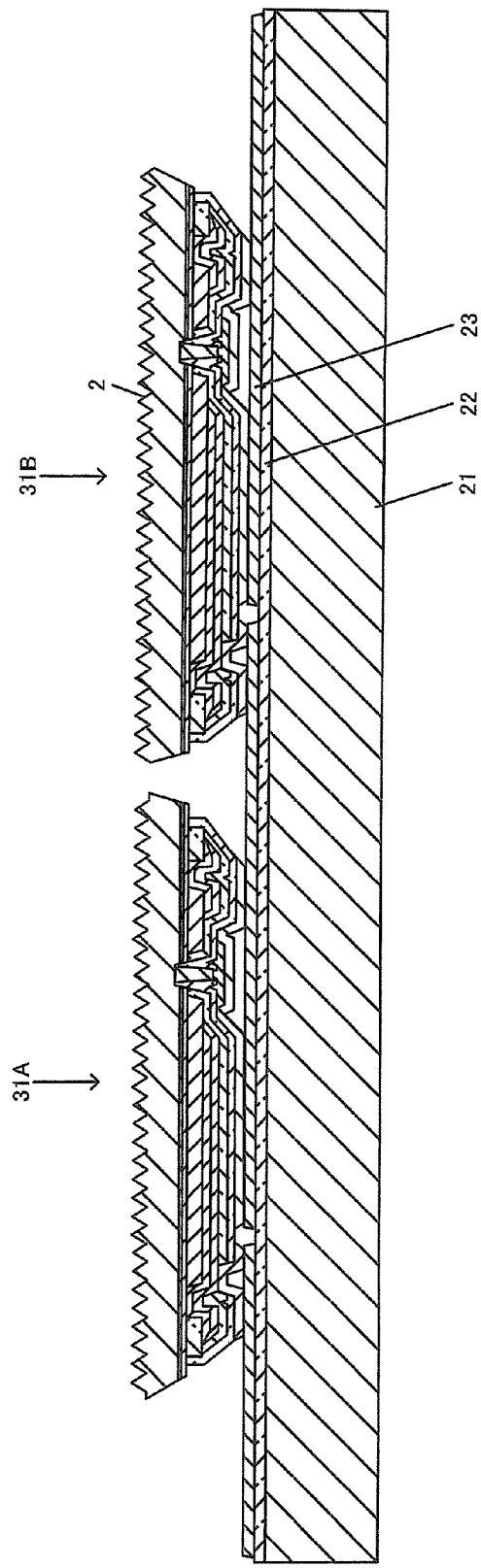

As illustrated in FIG. 1P, a light extracting structure or a micro-cone structure is formed by immersing the surface of the exposed n-type GaN layer 2, for example, in an alkaline solution such as a KOH solution to perform unevenness forming process, to form unevenness unique to crystal structure on the surface of the n-type GaN layer 2, enhancing light extracting efficiency.

Figure 1Q:
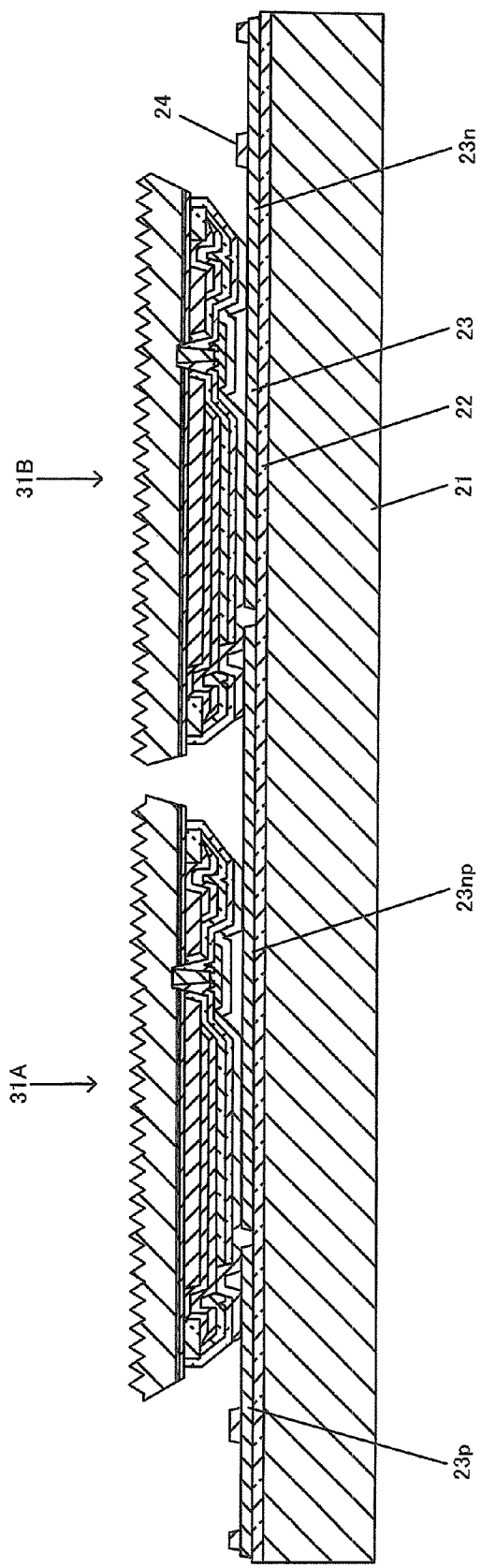

As illustrated in FIG. 1Q, a glare light absorption layer 24 is formed in the outer edge region of the electrodes 23*p* and 23*n* on the supporting substrate by depositing Ti having a thickness of 200 nm, for example, by an electron-beam deposition surrounding the region of wire bonding for power supply.

The glare light absorption layer 24 is formed with aperture at wire bonding region, exposes an AuSn layer of a supporting substrate electrode 23, and covers the outer region of the opening with the Ti layer. The Ti layer easily absorbs yellow light generated in the fluorescent layer formed by covering the element, compared to the AuSn layer. Therefore, yellow light is absorbed by the Ti layer 24 in the region around the wire bonding so that color unevenness or color separation in the peripheral portion of the light emitting apparatus can be prevented.

Figure 1R:
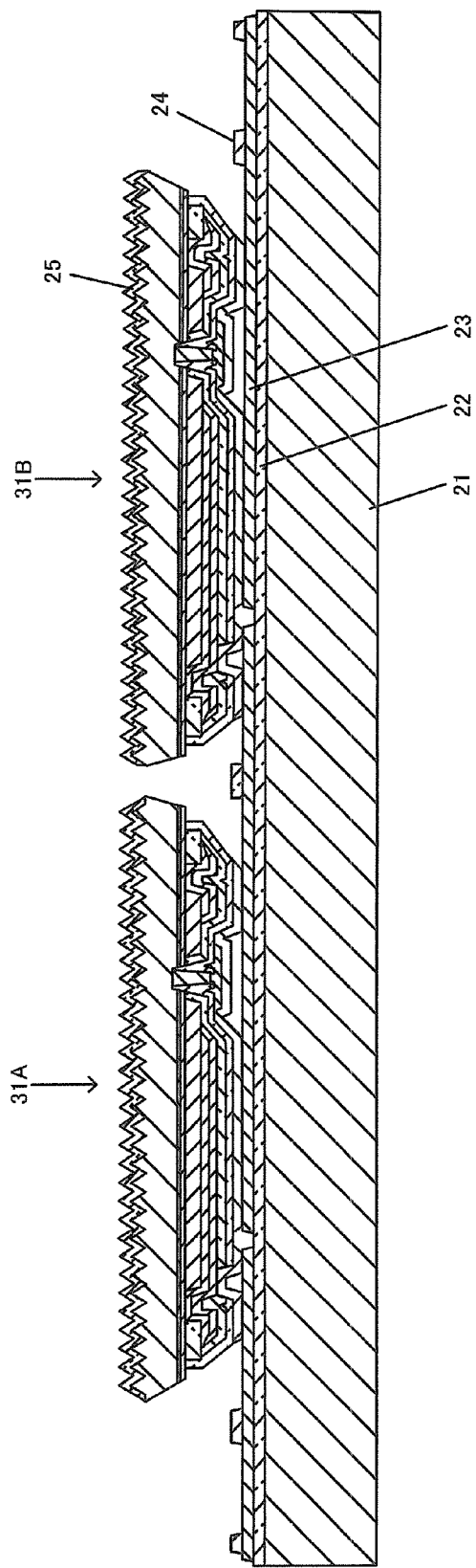

As illustrated in FIG. 1R, an entire surface protection film 25 is formed by depositing $SiO_2$ having a thickness of 350 nm on the entire upper surface of the element, for example, by chemical vapor deposition (CVD).

Figure 1S:
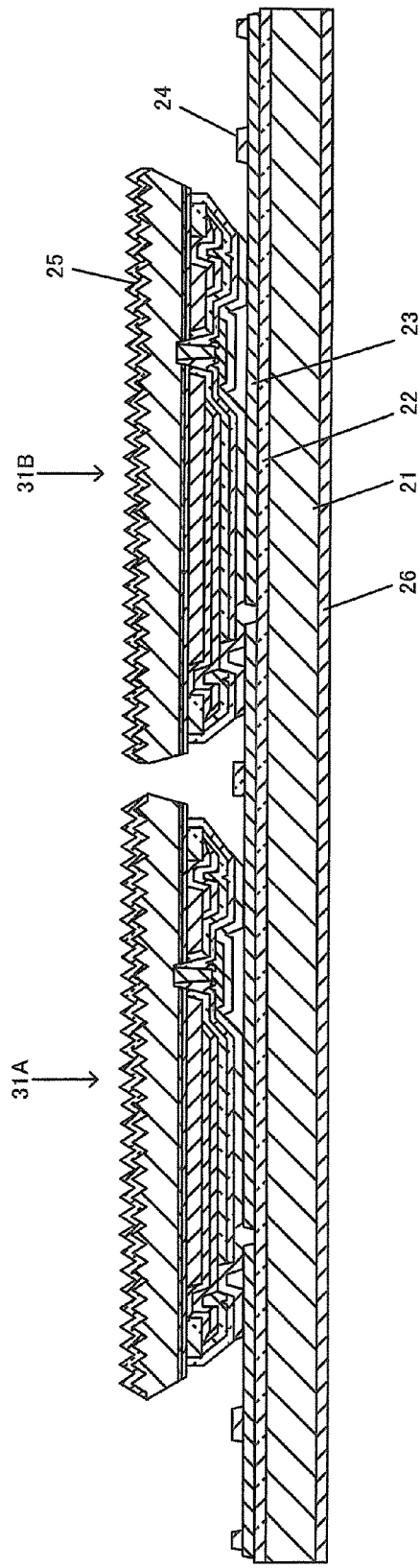

As illustrated in FIG. 1S, the back surface side of the supporting substrate 21 is ground or polished to thin the support substrate, for example, to a thickness of 300 μm, in order to lower thermal resistance. Additionally, a rear surface metal layer 26 is formed by depositing Ti/Pt/Au respectively having thicknesses of 50 nm, 15 nm, and 200 nm, for example, by electron beam deposition on the ground or polished surface of the supporting substrate 21, in order to secure adhesion between the mounting substrate and the joining material.

Figure 1T:
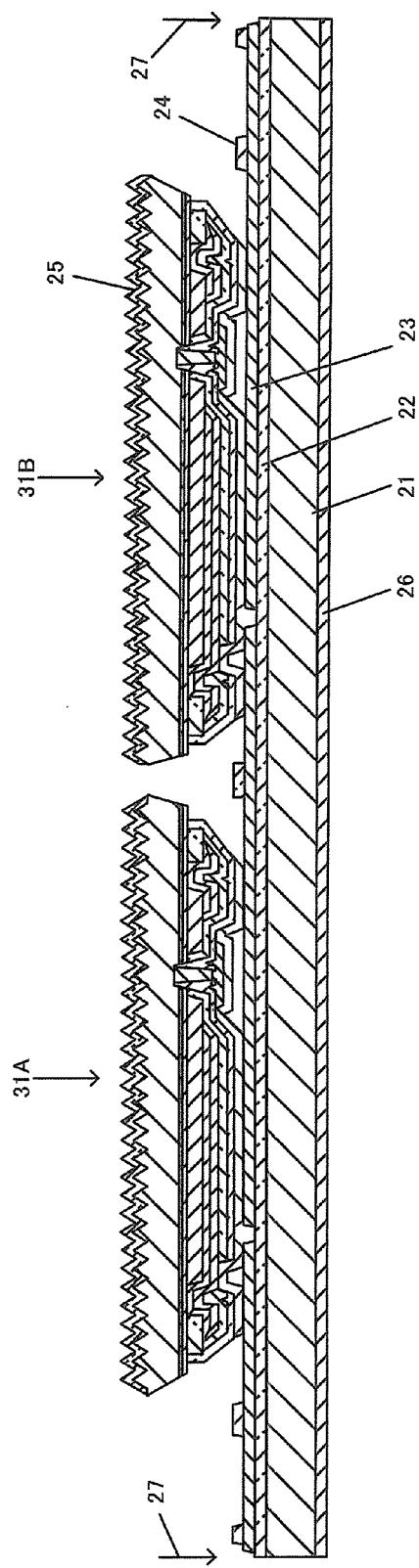

As illustrated in FIG. 1T, the supporting substrate 21 is divided by a laser scribe or dicing 27.

Figure 1U:
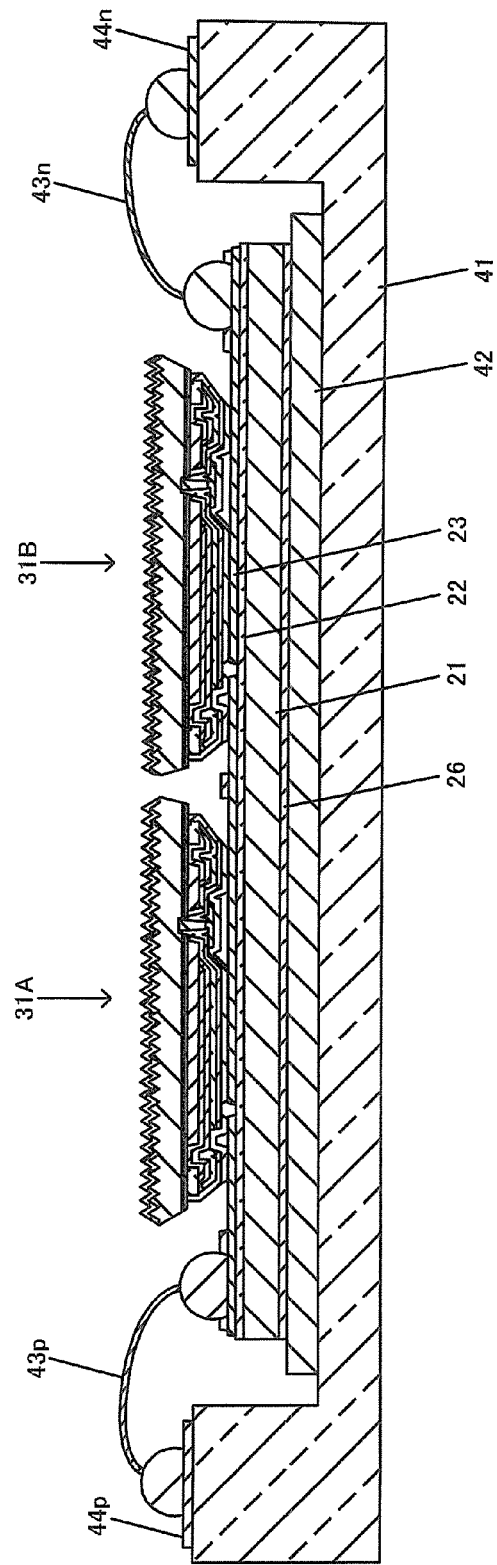

As illustrated in FIG. 1U, by using a bonding or joining material 42 such as an Ag paste or AuSn on a package substrate 41, die bonding is performed to the supporting substrate 21 connected with the element 31A and 31B are bonded to the package substrate 41. Thereafter, package mounting is completed by respectively connecting the p-side electrode of the element 31A and the n-side electrode of the element 31B to current supply pads 44*p* and 44*n* of the package substrate 41, by wire bondings 43*p* and 43*n* using an Au wire.

Figure 1V:
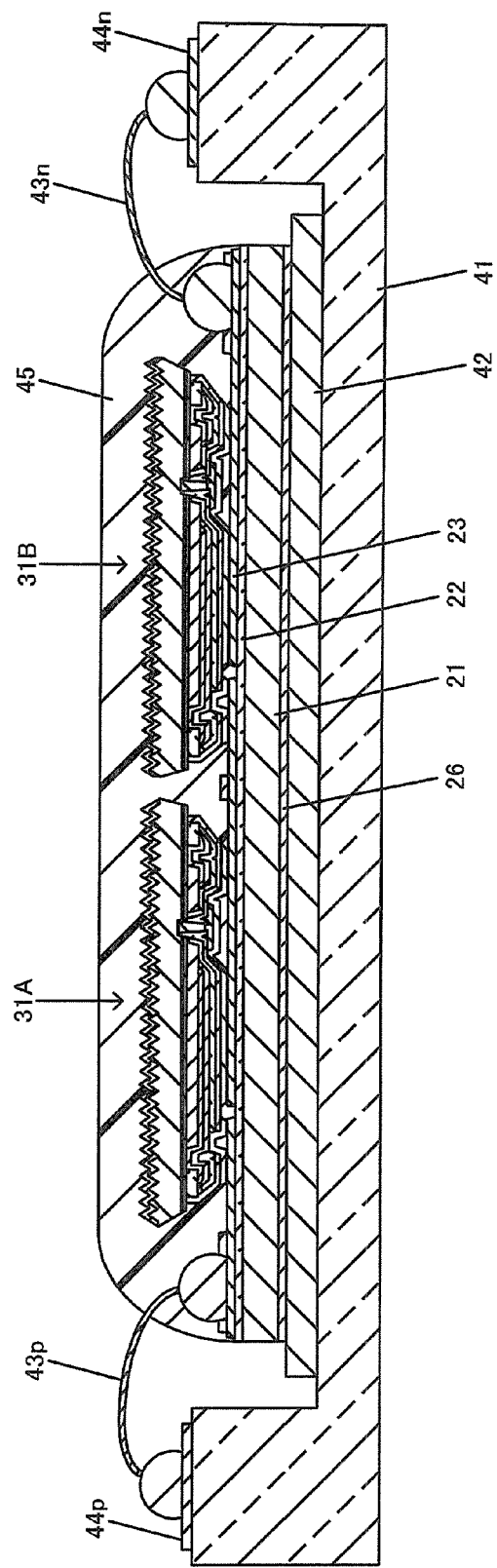

As illustrated in FIG. 1V, the light emitting elements 31A and 31B are sealed by sealing resin 45. For whitening the output light, phosphor such as yellow light emitting phosphor powders are mixed in the sealing resin. A sealing resin layer 45 is sealed, filled, and cured to form the resin layer 45. A semiconductor light emitting apparatus according to the first embodiment is thus formed.

Figure 4A:
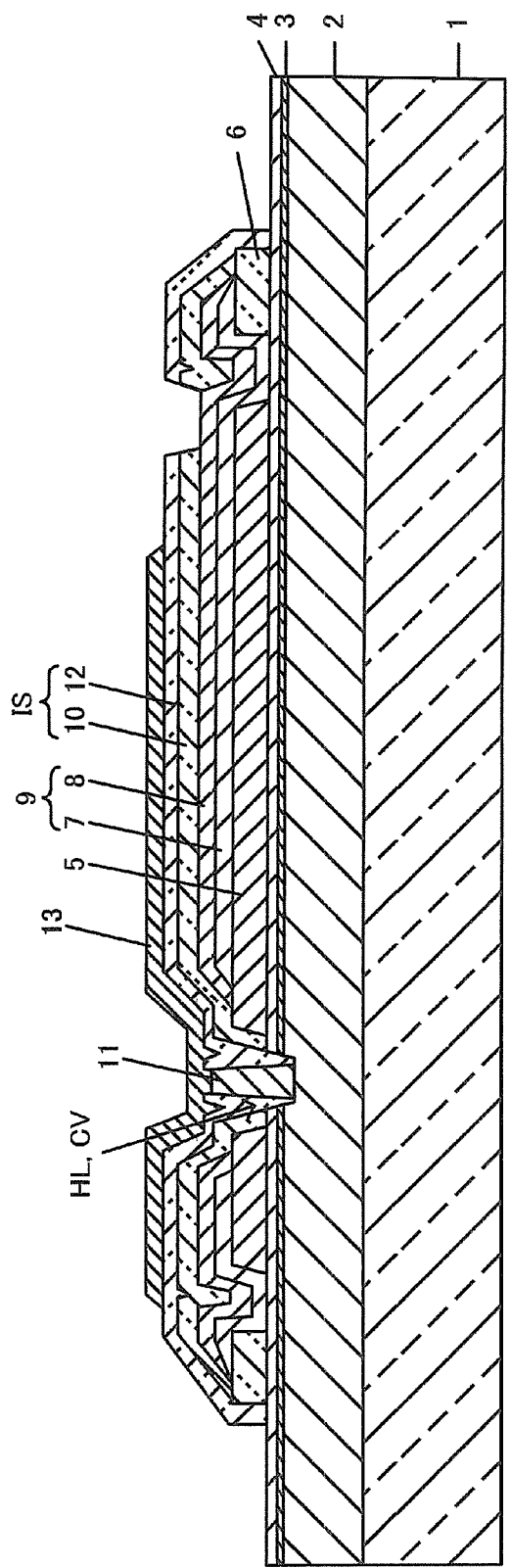
FIGS. 4A to 4C are schematic cross-sectional views illustrating processes of manufacturing a semiconductor light emitting apparatus according to a comparative example.
Figure 4B:
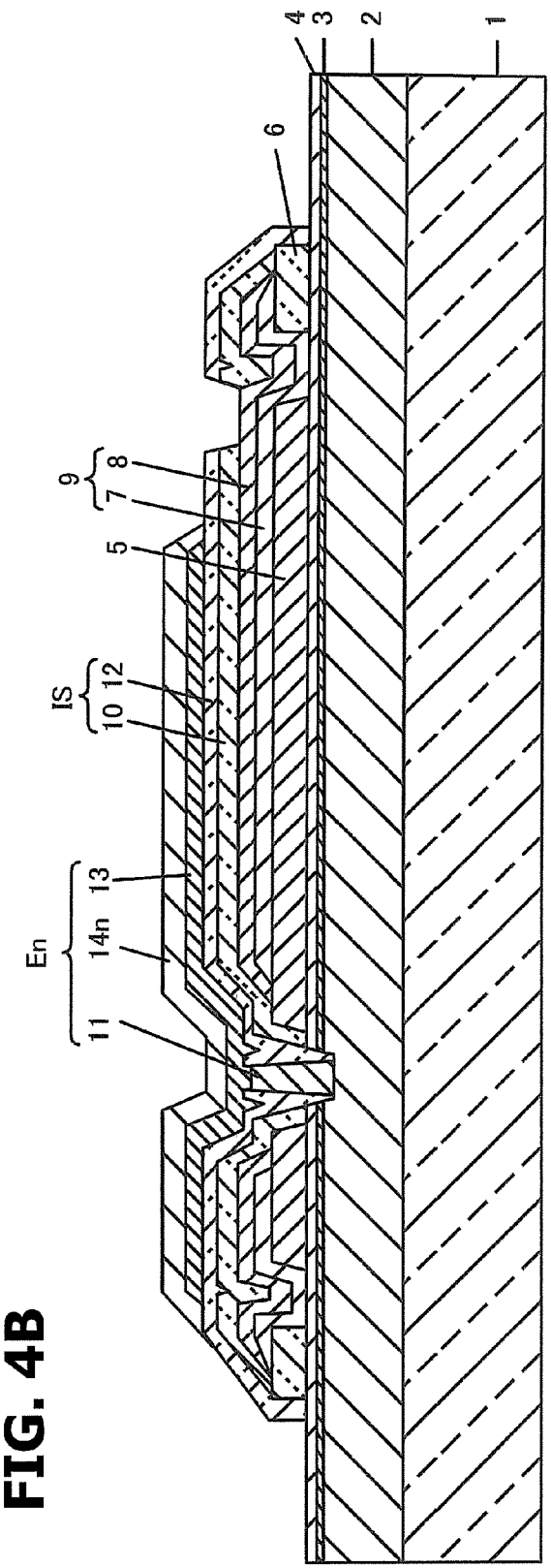
Figure 4C:
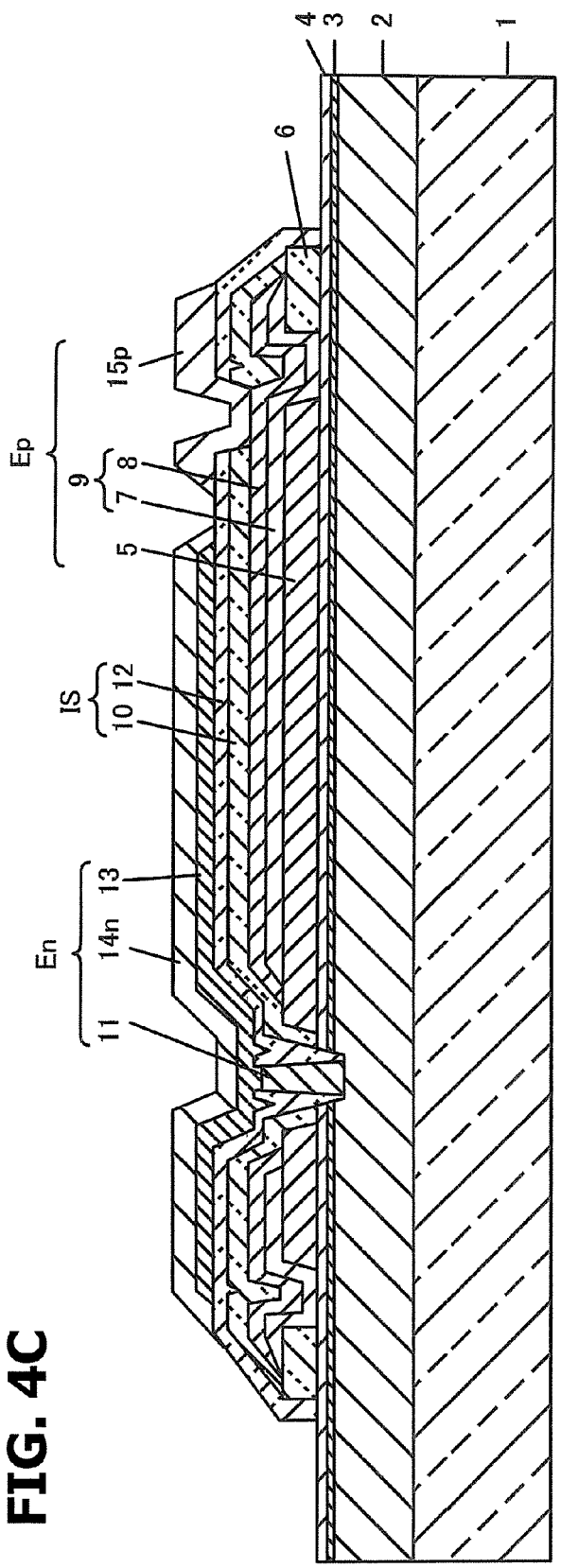

Subsequently, the semiconductor light emitting apparatus according to a comparative example will be described. FIGS. 4A to 4C are schematic cross-sectional views illustrating processes of manufacturing the semiconductor light emitting element according to the comparative example. Hereinafter, description will continue focusing on differences from the first embodiment. The processes up to the step of forming the contact hole CH described with reference to FIG. 1I are the same as the processes according to the first embodiment.

As illustrated in FIG. 4A, the n-side highly reflective layer 13 is formed on the n-side via electrode 11. The n-side highly reflective layer 13 of the comparative example is different from that of the first embodiment in that the n-side highly reflective layer 13 extends from on the n-side via electrode 11 to widely on the inter-electrode insulating layer IS covering the p-side highly reflective cap layer 9.

As illustrated in FIG. 4B, an n-side cap layer (connection electrode layer) 14*n* is formed, covering the n-side highly reflective layer 13. As illustrated in FIG. 4C, the connection electrode layer 15*p* is formed.

The connection electrode layers 14n and 15p constitute adhesion layers with the support substrate electrodes, and hence are desired to have enhanced flatness of the upper surface (even upper surface heights). In the first embodiment, the n-side highly reflective layer 13 does not ride on the inter-electrode insulating layer IS on the p-side highly reflective cap layer 9 (see FIG. 13). Accordingly, it becomes easy to form the connection electrode layers 14n and 14p on the flat upper surface of the inter-electrode insulating layer IS by the same process (to have the same film thicknesses), and to equalize the heights of the upper surfaces of the connection electrode layers 14n and 14p (see FIG. 1K).

According to the comparative example, the n-side highly reflective layer 13 is formed, riding on the inter-electrode insulating layer IS. When the heights of the upper surfaces of the n-side connection electrode 14n and the p-side connection electrode 15p are to be disposed at the same level, the thickness of the n-side connection electrode 14n should be different from that of the p-side connection electrode 15p (see FIG. 4C). Accordingly, the step of forming the n-side connection electrode 14n and the step of forming the p-side connection electrode 15p should become different processes. Additionally, it is difficult to uniformlize the heights of the films formed by different processes.

After the process of FIG. 4C, bonding with a support substrate, packaging to a package substrate, and the like are performed, in similar manner to the processes after the process of forming the street according to the first embodiment as illustrated in FIG. 1L, to provide a semiconductor light emitting apparatus according to the comparative example.

Figure 5A:
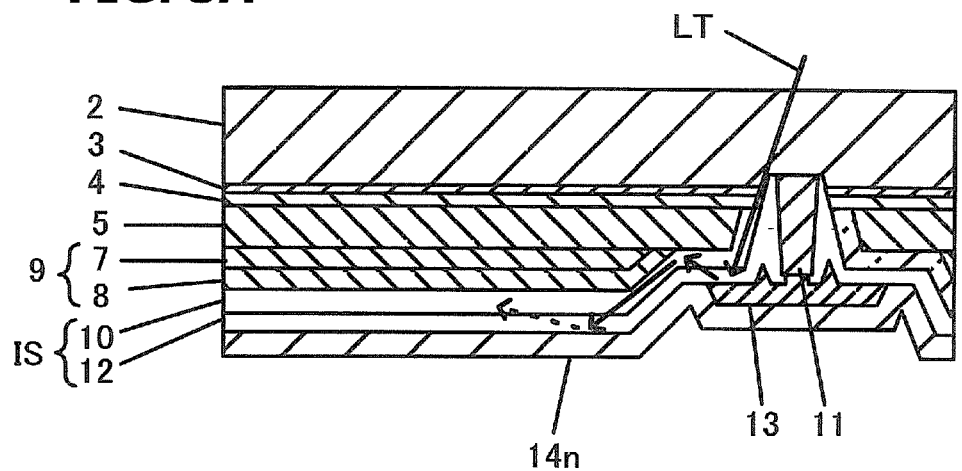
FIGS. 5A and 5B are schematic cross-sectional views illustrating structures in the vicinity of the n-side via electrodes of the light emitting apparatuses according to the first embodiment and the comparative example.
Figure 5B:
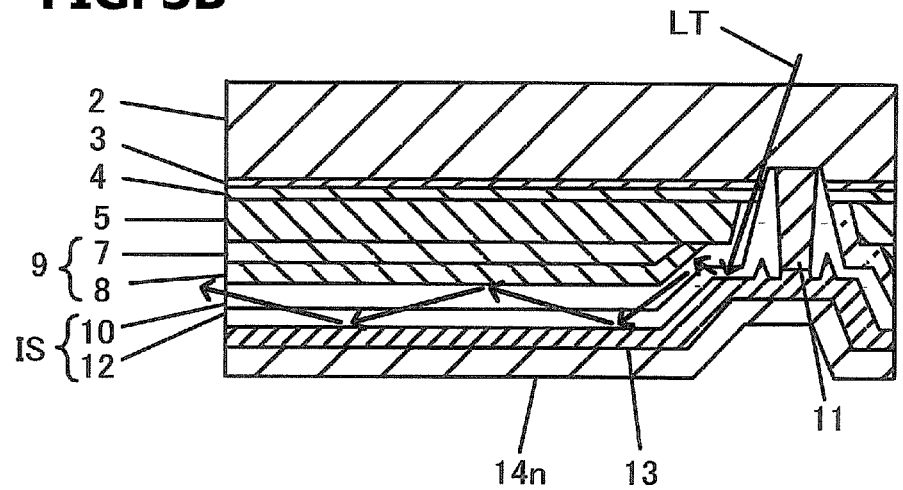

Description will be made on differences in light propagation in the elements according to the first embodiment and the comparative example, referring to FIGS. 5A and 5B. FIGS. 5A and 5B are schematic cross-sectional views illustrating portions in the vicinity of the n-side via electrodes of the light emitting apparatuses according to the first embodiment and the comparative example, respectively, and conceptually illustrate light propagation in the light emitting element. Yellow light is generated from the fluorescent material by the blue light emitted from the GaN light emitting layer 3. Yellow light LT backwardly scattered is introduced into the inter-electrode insulating layer IS in the vicinity of the n-side via electrode of the element.

As illustrated in FIG. 5B, according to the comparative example, the n-side highly reflective layer 13 is formed widely opposing the p-side highly reflective cap layer 9. Accordingly, the yellow light LT introduced into the inter-electrode insulating layer IS is propagated by repeating reflection between the n-side highly reflective layer 13 and the p-side highly reflective cap layer 9, to be released from end surface of the element. Thus, color unevenness or color separation can occur in end portions of the light emitting surface.

As illustrated in FIG. 5A, according to the first embodiment, the n-side highly reflective layer 13 is narrowly formed in the region that does not face the p-side highly reflective cap layer 9. Among the n-side electrodes, those which are formed up to a region facing the p-side highly reflective cap layer 9, is only the n-side cap layer (n-side connection electrode) 14n.

Accordingly, the yellow light LT inserted into the inter-electrode insulating layer IS is propagated between the n-side cap layer 14n and the p-side highly reflective cap layer 9. However, the n-side cap layer 14n has lower reflectance of the incident light, that is, a higher light absorbing property compared to the n-side highly reflective layer 13, and functions as a light absorbing layer. Therefore, according to the first embodiment, the propagated light can be attenuated by the incidence to the n-side cap layer 14n and color unevenness caused by the emission of the yellow light from the element edge surface and the like can be prevented.

It is preferable for the n-side highly reflective layer 13 to use Ag, Pt, Ni, Al, Pd, an alloy thereof, to have a high reflection function. The n-side cap layer 14n is formed, for example, of lamination of Ti/Pt/Au layers, in which a Ti layer is formed on the semiconductor layer side of the Pt layer, that is, on the light incident side. The thickness of the Ti layer is as thick as, for example, 50 nm, and hence the incident light rarely reaches the Pt layer.

The thickness of the Ti layer of the n-side cap layer 14n is preferably 20 nm or more (for example, 50 nm), in which function of absorbing light is enhanced. Here, TiN, Ni, Cr, or the like can be used, as well as Ti, as a material having the high light absorbing property.

In the structure according to the comparative example, since the n-side highly reflective layer 13 that includes easily migrating Ag is widely formed, the leakage easily occurs. In the structure according to the first embodiment, the n-side highly reflective layer 13 is more narrowly formed than that according to the comparative example. Therefore, there is an effect of restraining migration or leakage of Ag atoms.

As described above, the semiconductor light emitting element according to the first embodiment has the n-side highly reflective layer 13 serving as a reflective electrode formed as part of the n-side electrode En and the p-side electrode Ep formed as a reflecting electrode extending widely over the total area in such a manner that the peripheral portions of the n-side highly reflective layer 13 and the p-side electrode Ep around the hole overlap each other. Accordingly, light incident from the light emitting layer can be reflected by the n-side highly reflective layer 13 inside the hole and by the p-side electrode Ep outside the hole. Therefore, the light extracting efficiency can be enhanced.

Due to the facts that the overlapping of the n-side highly reflective layer 13 and the hole forming portion of the p-side electrode Ep is limited to peripheral portions, and that the n-side cap layer 14n serving as a light absorbing layer having a higher light absorbing property than the n-side highly reflective layer 13 is formed extending to the outside of the n-side highly reflective layer 13 as another portion of the n-side electrode En, light generated in the fluorescent layer and penetrated into the element is prevented from being propagated by repetitive reflection at the n-side highly reflective layer 13, and generation of color unevenness in the edge portion of the light emitting surface can be prevented.

A semiconductor light emitting apparatus according to the second embodiment will be described. FIGS. 6A to 6E are schematic cross-sectional views illustrating processes of manufacturing the semiconductor light emitting apparatus. Description will be made, focusing on differences from the first embodiment. The processes up to forming the recess CV described with reference to FIG. 1F are the same as the processes according to the first embodiment.

Figure 6A:
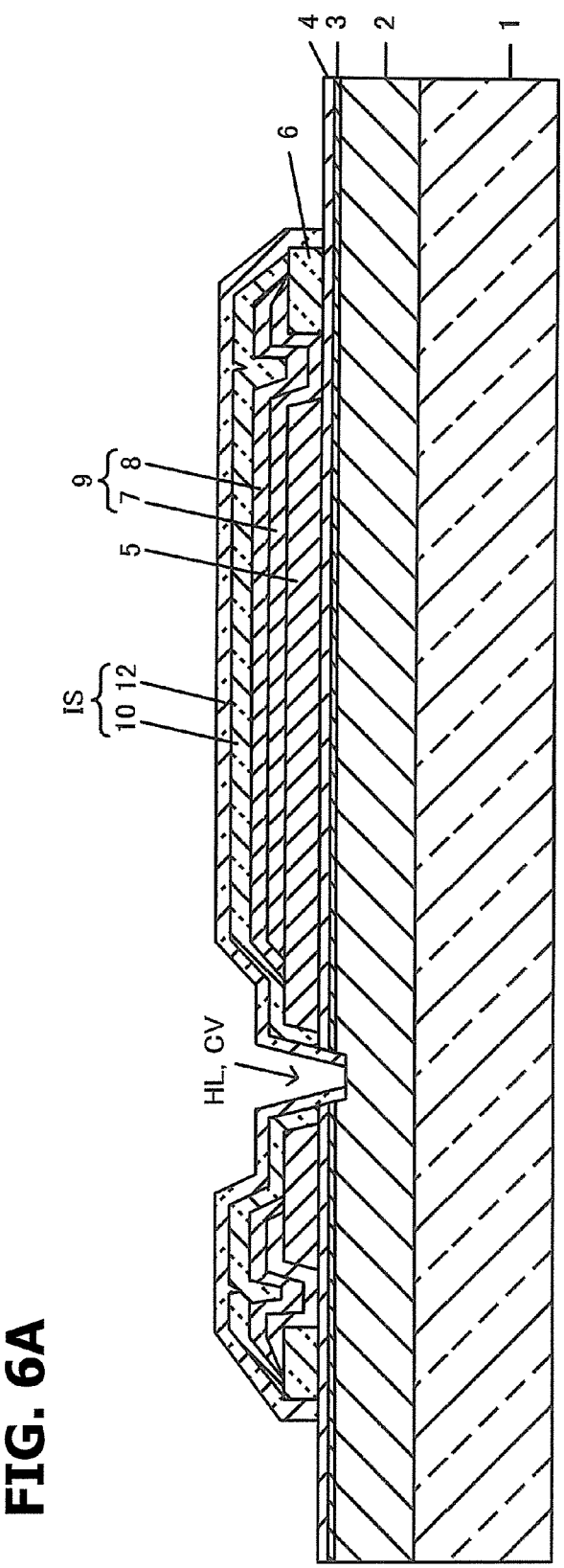
FIGS. 6A to 6E are schematic cross-sectional views illustrating processes of manufacturing a semiconductor light emitting apparatus according to a second embodiment.

As illustrated in FIG. 6A, unlike the first embodiment, the insulating floating layer 12 is formed in a state in which the columnar n-side via electrode is not formed in the recess CV. No n-side via electrode is formed. The insulating floating layer 12 is formed to extend in the hole HL and also into the recess CV, covering the pn junction region exposed at the side surface of the recess CV, and to be opened at the bottom of the recess CV to expose the n-type semiconductor layer 2. Same materials, film forming methods, and patterning methods as those of the first embodiment can be used for the insulating floating layer 12, for example.

Figure 6B:
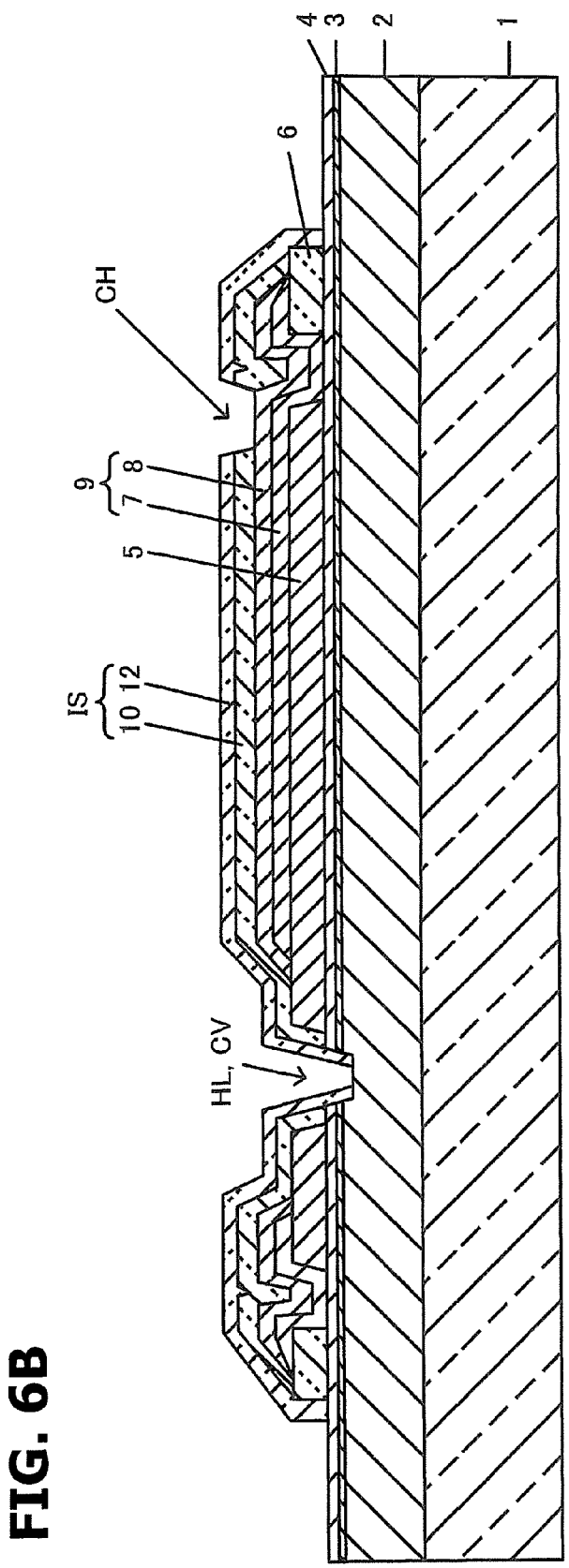

As illustrated in FIG. 6B, the contact hole CH is formed in the same manner as the process described with reference to FIG. 1I according to the first embodiment.

Figure 6C:
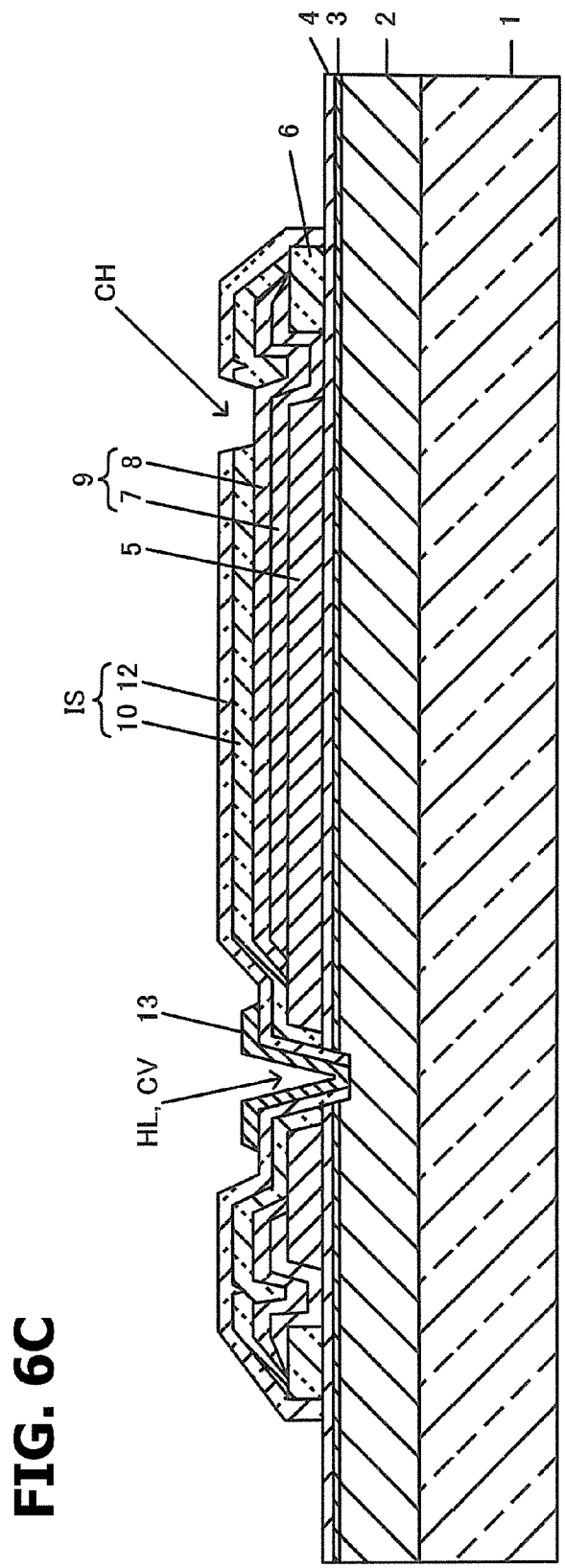

As illustrated in FIG. 6C, an n-side highly reflective layer 13 is formed, covering the inside surface of the recess CV. Same materials, film forming methods, and patterning methods as those of the first embodiment can be used for the n-side highly reflective layer 13, for example. According to the second embodiment, electrical connection with the n-type semiconductor layer 2 is secured by the n-side highly reflective layer 13 without using the columnar n-side via electrode. The n-side highly reflective layer 13 according to the second embodiment becomes the connection electrode contacting the n-type semiconductor layer 2 at the bottom of the recess CV and also functions as a highly reflective layer on the n-side electrode side. The structure in which the peripheral portion of the n-side highly reflective layer 13 overlaps with the peripheral portion of the p-side electrode layer 5 that defines the hole HL in plan view is the same as the first embodiment.

Figure 6D:
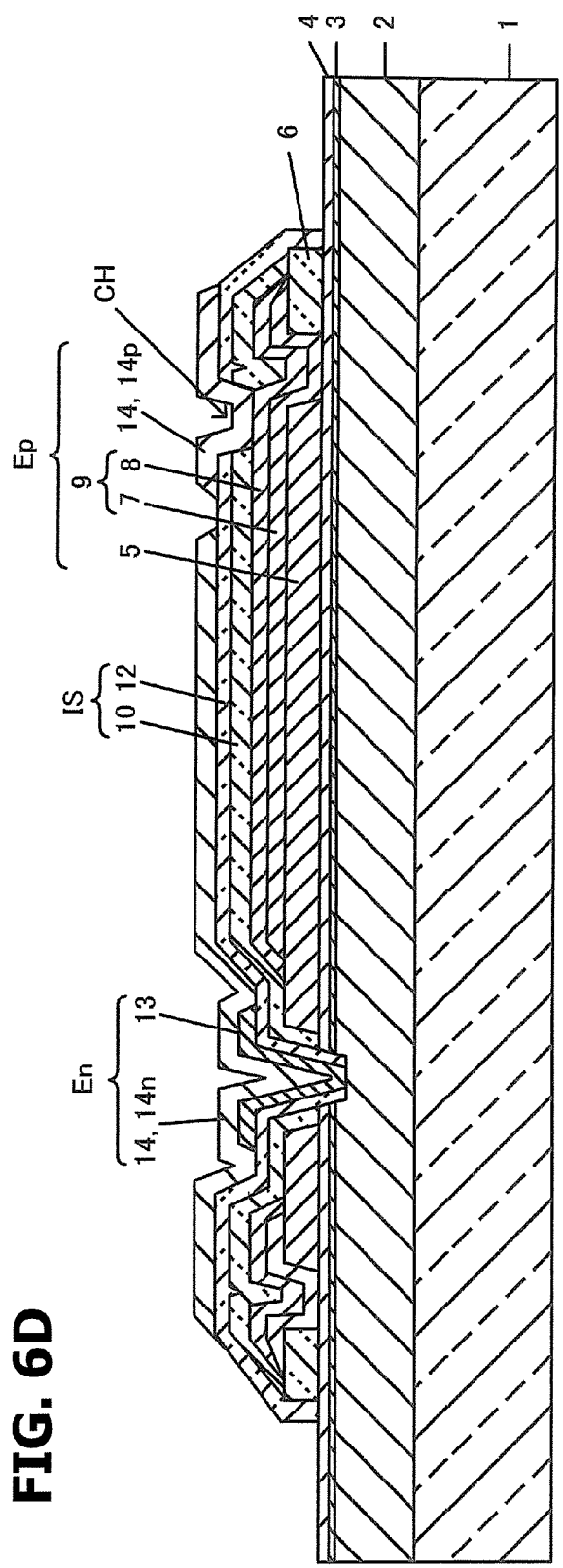

As illustrated in FIG. 6D, n-side cap layer 14 (the connection electrode layers 14n and 14p) is formed at the same time similar to the process illustrated in FIG. 1K. According to the second embodiment, the n-side highly reflective layer 13 and the n-side connection electrode 14n form the n-side electrode En of the element. Similar to the first embodiment, the p-side electrode layer 5, the p-side highly reflective cap layer 9, and the p-side connection electrode 14p form the p-side electrode Ep of the element.

After the process of FIG. 6D, bonding with the supporting substrate, mounting to the package substrate, and so on are performed in similar manner the first embodiment as illustrated in FIG. 1L and on. The semiconductor light emitting apparatus according to the second embodiment is thus formed.

Figure 6E:
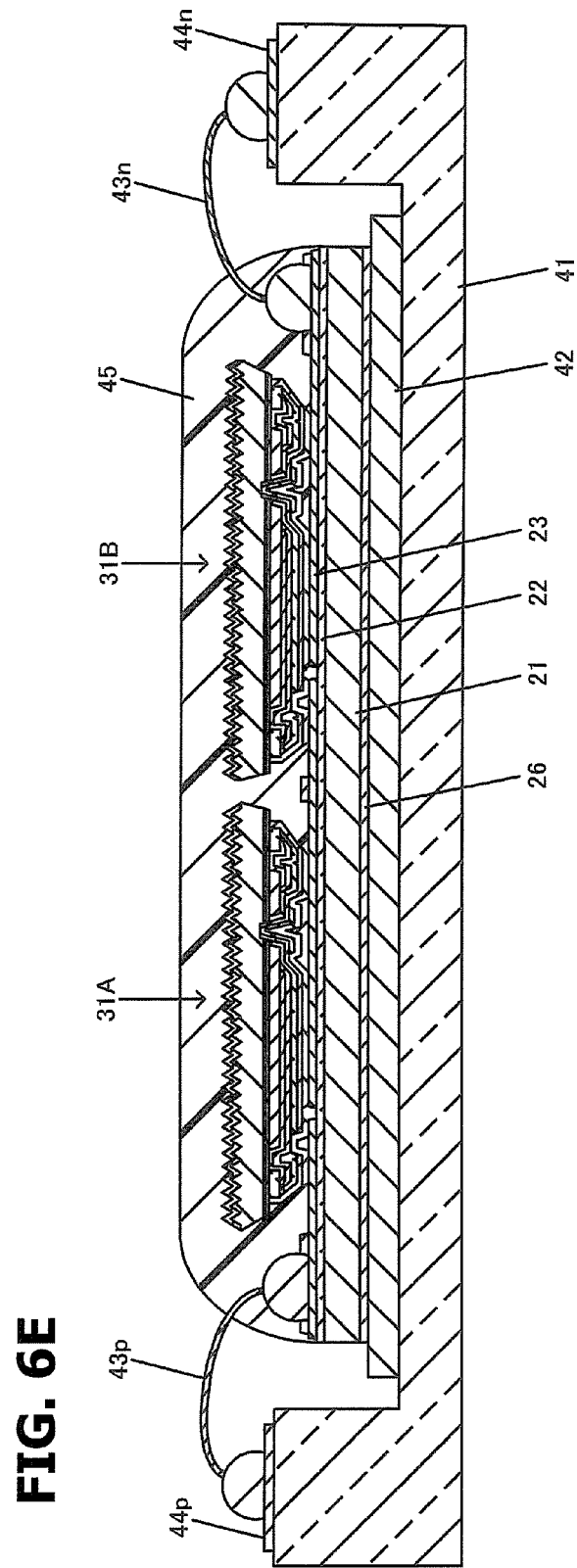

FIG. 6E illustrates the semiconductor light emitting apparatus according to the second embodiment in a state as completed by forming the sealing resin layer 45 (including fluorescent powders).

Figure 7:
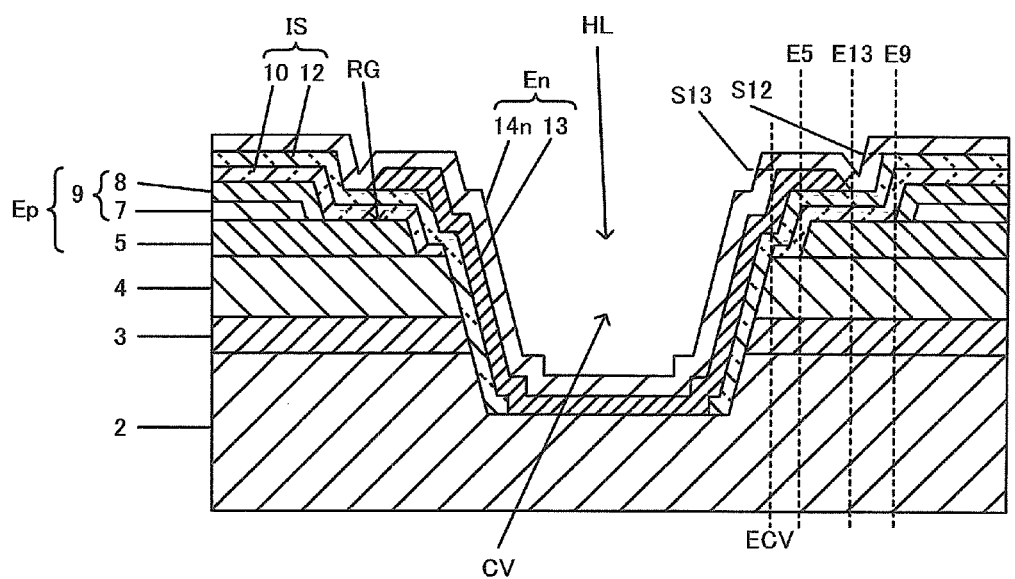
FIG. 7 is a schematic cross-sectional view illustrating structure in the vicinity of the n-side highly reflective layer of the semiconductor light emitting element according to the second embodiment.

FIG. 7 is an elevated cross-section illustrating the portion in the vicinity of the n-side highly reflective layer of the semiconductor light emitting element according to the second embodiment, and corresponds to FIG. 3A of the first embodiment. The schematic plane structure of the dispositions of the n-side highly reflective layer and so on are common to FIGS. 3B and 3C as described in the first embodiment.

The recess CV that exposes the n-type semiconductor layer 2 at the bottom is formed in the hole HL formed in the p-side electrode layer 5. The n-side highly reflective layer 13 according to the second embodiment contacts the n-type semiconductor layer 2 at the bottom of the recess CV.

In plan view, in the same manner as the structure described in the first embodiment, the n-side highly reflective layer 13 is formed to have the peripheral portion which overlaps the peripheral portion of the p-side electrode Ep defining the hole HL, and does not overlap the p-side highly reflective cap layer 9. The n-side cap layer 14n overlaps the p-side highly reflective cap layer 9 in plan view.

In the same manner as in the first embodiment, the inter-electrode insulating layer IS is formed to ride on the upper surface of the p-side highly reflective cap layer 9 in the region outside the edge E9. A height S13 of the upper surface of the peripheral portion of the n-side highly reflective layer 13 riding on the region RG is lower than a height S12 of the upper surface of the inter-electrode insulating layer IS in the region outside the edge E9.

In the semiconductor light emitting element according to the second embodiment, in similar manner to the semiconductor light emitting element of the first embodiment, the light incident from the light emitting layer is reflected by the n-side highly reflective layer 13 inside the hole and by the p-side electrode Ep outside the hole, enhancing the light extracting efficiency. Additionally, color unevenness and the like in the edge portion of the light emitting surface can be prevented, in similar manner to the semiconductor light emitting element according to the first embodiment described with reference to FIGS. 5A and 5B.

As described with reference to FIG. 2, a plurality of connection electrodes for providing electrical conduction to the n-type semiconductor layer are disposed in the element. If the number of n-side connection electrodes is increased and the number of columnar via electrodes according to the first embodiment becomes multiple, there is a possibility that stress applied to the element semiconductor layer caused by the thermal deformation of the columnar via electrodes accompanied by driving the element becomes large. The layered n-side electrode structure serving also as highly reflective layer, without using columnar via electrodes as the connection electrodes, similar to the second embodiment, is expected to provide effect of preventing stress. Additionally, process of forming the columnar via electrode may be omitted.

The invention has been described along the embodiments, but the invention is not limited thereto. For example, it is obvious to those skilled in the art that various modifications, improvements, combinations, and the like are possible.

What are claimed are:

1. A semiconductor light emitting apparatus comprising:
   a first semiconductor layer of a first conductivity type;
   a light emitting layer formed on the first semiconductor layer;
   a second semiconductor layer of a second conductivity type opposite to the first conductivity type, the second semiconductor layer being formed on the light emitting layer and having an upper surface;
   a recess formed from the upper surface of the second semiconductor layer, said recess penetrating through the second semiconductor layer and the light emitting layer and exposing the first semiconductor layer at a bottom of the recess;
   a first electrode electrically connected to the first semiconductor layer at the bottom of the recess and extending upward to extend above the upper surface of the second semiconductor layer;
   a second electrode electrically connected to the upper surface of the second semiconductor layer and having an opening which surrounds the recess in plan view and through which the first electrode extends from an inside of the recess to above the upper surface of the second semiconductor layer; and
   an insulating layer disposed between the first and second electrodes above the upper surface of the second semiconductor layer;
   wherein the second electrode comprises a reflective electrode that reflects light incident from the light emitting layer side,
   wherein the first electrode includes a reflective electrode layer formed covering the opening in plan view that reflects light incident from the light emitting layer side,
   wherein the reflective electrode layer of the first electrode has a peripheral portion overlapping a peripheral portion of the second electrode defining the opening in plan view,
   wherein the first electrode further includes a light absorbing electrode layer formed on the reflective electrode layer of the first electrode and having a lower reflectance against incident light from the light emitting layer side than the reflective electrode layer of the first electrode, and wherein the light absorbing electrode layer is formed to spread to a more outer area than the peripheral portion of the reflective electrode layer in plan view.

2. The semiconductor light emitting apparatus according to claim 1, wherein:
the first electrode further includes a contact electrode connected to the first semiconductor layer at the bottom of the recess, and the reflective electrode layer is disposed above the contact electrode.

3. The semiconductor light emitting apparatus according to claim 1, wherein:
the second electrode includes a first layer and a second layer formed on the first layer, the opening is defined by first periphery of the first layer, and the second layer has second periphery surrounding the opening and disposed on a more outer side of the opening than the first periphery, and
the reflective electrode layer of the first electrode has a third periphery disposed between the first and the second peripheries in plan view.

4. The semiconductor light emitting apparatus according to claim 1, wherein:
the light absorbing electrode layer of the first electrode is formed to spread in a more outer area than the second periphery of the second layer of the second electrode, and overlaps the second layer in plan view.

5. The semiconductor light emitting apparatus according to claim 1, wherein:
the insulating layer includes a first insulating layer covering a side surface of the recess and the second electrode, and not covering a bottom surface of the recess, and
the first electrode extends on portions of the first insulating layer on the side surface of the recess and on the second semiconductor layer and extends to a portion overlapping the second electrode.

6. The semiconductor light emitting apparatus according to claim 1, wherein:
the first semiconductor layer and the second semiconductor layer are compound semiconductor layers including GaN and the light emitting layer has a multiple quantum well structure of a compound semiconductor layer including GaN.

7. The semiconductor light emitting apparatus according to claim 6, wherein:
the second electrode includes an Ag undermost layer including an additive and another Ag layer disposed thereon and not including an additive.

8. The semiconductor light emitting apparatus according to claim 7, wherein:
the first electrode includes a light reflecting layer and a contact layer, the contact layer being disposed between the light reflecting layer and the first semiconductor layer and having a lower reflectance than the light reflecting layer.

9. The semiconductor light emitting apparatus according to claim 8, further comprising:
a sealing resin layer covering the second semiconductor layer, the first electrode, and the second electrode; and
a phosphor mixed in the sealing resin layer.

10. A semiconductor light emitting apparatus, comprising:
a first semiconductor light emitting element;
a second semiconductor light emitting element; and
a supporting substrate formed with supporting electrodes, wherein the first semiconductor light emitting element includes:
a first semiconductor layer of a first conductivity type;
a first light emitting layer formed on the first semiconductor layer;
a second semiconductor layer of a second conductivity type opposite to the first conductivity type, the second semiconductor layer being formed on the first light emitting layer and having a first upper surface;
a first recess formed from the first upper surface of the second semiconductor layer, said first recess penetrating through the second semiconductor layer and the first light emitting layer and exposing the first semiconductor layer at a bottom of the first recess;
a first electrode electrically connected to the first semiconductor layer at the bottom of the first recess and extending upward to extend above the first upper surface of the second semiconductor layer;
a second electrode electrically connected to the first upper surface of the second semiconductor layer and having a first opening which surrounds the first recess in plan view and through which the first electrode extends from an inside of the first recess to above the first upper surface of the second semiconductor layer; and
a first insulating layer disposed between the first and second electrodes above the first upper surface of the second semiconductor layer;
wherein the second electrode comprises a reflective electrode that reflects light incident from the first light emitting layer side,
wherein the first electrode includes a first reflective electrode layer formed covering the first opening in plan view that reflects light incident from the first light emitting layer side, and
wherein the first reflective electrode layer of the first electrode has a peripheral portion overlapping a peripheral portion of the second electrode defining the first opening in plan view, and wherein the second semiconductor light emitting element includes:
a third semiconductor layer of a first conductivity type;
a second light emitting layer formed on the third semiconductor layer;
a fourth semiconductor layer of a second conductivity type opposite to the first conductivity type, the fourth semiconductor layer being formed on the second light emitting layer and having a second upper surface;
a second recess formed from the second upper surface of the fourth semiconductor layer, said second recess penetrating through the fourth semiconductor layer and the second light emitting layer and exposing the third semiconductor layer at a bottom of the second recess;
a third electrode electrically connected to the third semiconductor layer at the bottom of the second recess and extending upward to extend above the second upper surface of the fourth semiconductor layer;
a fourth electrode electrically connected to the second upper surface of the fourth semiconductor layer and having a first opening which surrounds the second recess in plan view and through which the third electrode extends from an inside of the second recess to above the second upper surface of the fourth semiconductor layer; and a second insulating layer disposed between the third and fourth electrodes above the second upper surface of the fourth semiconductor layer;

wherein the fourth electrode comprises a reflective electrode that reflects light incident from the second light emitting layer side, wherein the third electrode includes a second reflective electrode layer formed covering the second opening in plan view that reflects light incident from the second light emitting layer side, wherein the second reflective electrode layer of the third electrode has a peripheral portion overlapping a peripheral portion of the fourth electrode defining the second opening in plan view, and wherein the supporting electrodes electrically connect the first electrode of the first semiconductor light emitting element and the fourth electrode of the second semiconductor light emitting element.

11. The semiconductor light emitting apparatus according to claim 10, further comprising:

a sealing resin layer covering the first and the second semiconductor light emitting elements; and a phosphor mixed in the sealing resin layer.

* * * * *